United States Patent
Toshiyoshi et al.

(10) Patent No.: US 12,215,019 B2
(45) Date of Patent: Feb. 4, 2025

(54) ELECTROSTATIC DEVICE, ELECTROSTATIC DEVICE INTERMEDIATE BODY AND PRODUCTION METHOD

(71) Applicants: The University of Tokyo, Tokyo (JP); Saginomiya Seisakusho, Inc., Tokyo (JP)

(72) Inventors: Hiroshi Toshiyoshi, Tokyo (JP); Hiroaki Honma, Tokyo (JP); Hiroyuki Mitsuya, Sayama (JP)

(73) Assignees: The University of Tokyo, Tokyo (JP); Saginomiya Seisakusho, Inc., Tokyo (JP)

( * ) Notice: Subject to any disclaimer, the term of this patent is extended or adjusted under 35 U.S.C. 154(b) by 337 days.

(21) Appl. No.: 17/615,978

(22) PCT Filed: Mar. 19, 2020

(86) PCT No.: PCT/JP2020/012459
§ 371 (c)(1),
(2) Date: Dec. 2, 2021

(87) PCT Pub. No.: WO2020/246116
PCT Pub. Date: Dec. 10, 2020

(65) Prior Publication Data
US 2022/0324697 A1    Oct. 13, 2022

(30) Foreign Application Priority Data
Jun. 6, 2019  (JP) .................................. 2019-106231

(51) Int. Cl.
*H02N 1/08* (2006.01)
*B81B 3/00* (2006.01)
(Continued)

(52) U.S. Cl.
CPC .......... *B81B 3/0021* (2013.01); *B81B 3/0051* (2013.01); *H01G 7/02* (2013.01);
(Continued)

(58) Field of Classification Search
CPC ................................ H02N 1/08; B81B 3/0021
(Continued)

(56) References Cited

U.S. PATENT DOCUMENTS 8,564,169 B2 * 10/2013 Sano ........................ H02N 1/08
310/309
8,803,401 B2 *  8/2014 Nakatsuka ............... H02N 1/08
310/309
(Continued)

FOREIGN PATENT DOCUMENTS

JP      2010011547 A  *  1/2010
JP      2010068643 A  *  3/2010
(Continued)

OTHER PUBLICATIONS

JP-2010011547-A Machine Translation (Year: 2010).*
(Continued)

*Primary Examiner* — Tran N Nguyen
*Assistant Examiner* — Masoud Vaziri
(74) *Attorney, Agent, or Firm* — Workman Nydegger

(57) ABSTRACT

An electrostatic device includes: a fixed portion, a moveable portion, and an elastically-supporting portion that are formed in a same substrate; and a first glass package and a second glass package that are anodically bonded to each other on one and the other of front and back surfaces of the substrate with the fixed portion and the elastically-supporting portion separated from each other, the second glass package forms a sealed space in which the moveable portion is arranged between the first and second glass packages, an electret is formed at least partially in the fixed portion and
(Continued)

the moveable portion, and a first electrode connected to the fixed portion and exposed on an outer surface of the second glass package and a second electrode connected to the elastically-supporting portion and exposed on the outer surface of the second glass package are formed in the second glass package.

7 Claims, 23 Drawing Sheets

(51) Int. Cl.
*H01G 7/02* (2006.01)
*H02N 2/18* (2006.01)

(52) U.S. Cl.
CPC ............. *H02N 1/08* (2013.01); *H02N 2/186* (2013.01); *B81B 2203/0136* (2013.01); *B81B 2203/0346* (2013.01); *B81B 2203/0353* (2013.01); *B81B 2203/04* (2013.01)

(58) Field of Classification Search
USPC ........................................................ 310/309
See application file for complete search history.

(56) References Cited

U.S. PATENT DOCUMENTS

| | | | | |
|---|---|---|---|---|
| 2010/0085622 A1* | 4/2010 | Hofmann | ............ | B81C 1/00166 |
| | | | | 156/292 |
| 2011/0316384 A1* | 12/2011 | Nakatsuka | ............... | H02N 1/08 |
| | | | | 310/300 |
| 2013/0320803 A1* | 12/2013 | Maeda | ................ | B81C 1/00293 |
| | | | | 310/300 |
| 2014/0065751 A1* | 3/2014 | Suzuki | ................ | B81C 1/00436 |
| | | | | 438/50 |
| 2015/0094786 A1* | 4/2015 | Deterre | ................ | A61N 1/3756 |
| | | | | 310/309 |
| 2015/0115770 A1* | 4/2015 | Johnson | ................... | H02N 1/08 |
| | | | | 310/309 |
| 2015/0236619 A1* | 8/2015 | Hattori | ..................... | H02N 1/08 |
| | | | | 310/309 |
| 2017/0010299 A1* | 1/2017 | Kigure | .................. | B81B 3/0072 |
| 2017/0370352 A1* | 12/2017 | Fujita | ..................... | H01G 11/08 |
| 2018/0205915 A1 | 7/2018 | Krylov et al. | | |
| 2018/0294746 A1* | 10/2018 | Okada | ....................... | H02N 1/08 |
| 2019/0014419 A1* | 1/2019 | Hashiguchi | ............... | H02N 1/08 |
| 2019/0058420 A1* | 2/2019 | Toshiyoshi | ............... | H02N 1/08 |
| 2021/0119556 A1* | 4/2021 | Toshiyoshi | ............... | H01G 7/02 |
| 2021/0119566 A1 | 4/2021 | Kumakura et al. | | |

FOREIGN PATENT DOCUMENTS

| | | | | |
|---|---|---|---|---|
| JP | 2010-512548 A | | 4/2010 | |
| JP | 2010216846 A | * | 9/2010 | |
| JP | 2013-250133 A | | 12/2013 | |
| JP | 2018-088780 A | | 6/2018 | |
| JP | 2018-523846 A | | 8/2018 | |

OTHER PUBLICATIONS

JP-2010068643-A Machine Translation (Year: 2010).*
JP-2010216846-A Machine Translation (Year: 2010).*
International Preliminary Report on Patentability dated Dec. 7, 2021, issue in PCT Application No. PCT/JP2020/012459, filed Mar. 19, 2020.
Y. Lu et al., *A Nonlinear MEMS Electrostatic Kinetic Energy Harvester for Human-Powered Biomedical Devices*, Applied Physics Letters, vol. 107, No. 24, Dec. 22, 2015, pp. 253902-1-253901-5.
Communication Pursuant to Article 94(3) EPC dated Sep. 13, 2023, issued in EP Application No. 20819070.2.
Extended European Search Report dated Jan. 11, 2023, issued in EP Application No. 20819070.2.
Chinese First Office Action, mailed Feb. 8, 2024, from Chinese App. No. 202080040859.9, 16 pages.

* cited by examiner

ELECTROSTATIC DEVICE, ELECTROSTATIC DEVICE INTERMEDIATE BODY AND PRODUCTION METHOD

TECHNICAL FIELD

The present invention relates to an electrostatic device, an electrostatic device intermediate body, and a production method thereof.

BACKGROUND ART

A method of generating power by using a microelectromechanical systems (MEMS) vibration element (for example, see Patent Literature 1) is known as one of energy harvesting technologies for harvesting energy from ambient vibration. A vibration-driven energy harvesting element includes a piezoelectric element and an electrostatic capacitance element and is an element that generates AC power with frequencies that are equal to and an integral multiple of a frequency of vibration of the vibration-driven energy harvesting element in the case where the vibration-driven energy harvesting element is made to vibrate at a frequency of ambient vibration. In the vibration-driven energy harvesting element, an entire chip needs to be put in a vacuum package to improve response to micro vibration and to prevent degradation of an electret.

CITATION LIST

Patent Literature

Patent Literature 1: Japanese Patent Laid-Open No. 2018-088780

SUMMARY OF INVENTION

Technical Problem

However, since the vibration-driven energy harvesting element has a structure that deforms by external vibration, a space needs to be provided around the vibration-driven energy harvesting element and the entire chip in which the vibration-driven energy harvesting element is formed is housed in a package. Since the vibration-driven energy harvesting element is configured such that the vibration-driven energy harvesting element chip is formed and is then housed in a package formed separately from the vibration-driven energy harvesting element as described above, the size of the vibration-driven energy harvesting element including the package increases and the cost also increases.

Solution to Problem

According to a first aspect of the present invention, an electrostatic device includes: a fixed portion, a moveable portion, and an elastically-supporting portion that are formed in a same substrate, the elastically-supporting portion elastically supporting the moveable portion; a first glass package that is anodically bonded to one of front and back surfaces of the substrate with the fixed portion and the elastically-supporting portion separated from each other; and a second glass package that is anodically bonded to the other one of the front and back surfaces with the fixed portion and the elastically-supporting portion separated from each other and that forms a sealed space in which the moveable portion is arranged between the first and second glass packages, an electret is formed at least partially in the fixed portion and the moveable portion, and a first electrode connected to the fixed portion and exposed on an outer surface of the second glass package and a second electrode connected to the elastically-supporting portion and exposed on the outer surface of the second glass package are formed in the second glass package.

According to a second aspect of the present invention, it is preferable that, in the electrostatic device of the first aspect, a fixed electrode is formed in the fixed portion, a movable electrode facing the fixed electrode is formed in the moveable portion, the electret is formed in at least one of the fixed electrode and the movable electrode, the sealed space in which the fixed electrode and the movable electrode are arranged is set to a vacuum state, and displacement of the moveable portion relative to the fixed portion causes an electrostatic capacitance between the fixed electrode and the movable electrode to change and the electrostatic device generates power.

A production method according to a third aspect of the present invention is a production method of producing the electrostatic device according to the first or second aspect, including: forming the fixed portion, the moveable portion, and the elastically-supporting portion in the substrate in an integral state; stacking the substrate on the first glass package; applying anodical bonding voltage between the first glass package and the substrate to anodically bond the fixed portion and the elastically-supporting portion to the first glass package; etching the substrate to separate the fixed portion and the elastically-supporting portion from each other; stacking the second glass package on the substrate to which the first glass package is anodically bonded; applying anodical bonding voltage between the elastically-supporting portion and the second glass package while applying electret formation voltage between the elastically-supporting portion and the fixed portion to anodically bond the fixed portion and the elastically-supporting portion to the second glass package and to form the electret; and forming the first electrode connected to the fixed portion and exposed on the outer surface of the second glass package and the second electrode connected to the moveable portion and exposed on the outer surface of the second glass package.

According to a fourth aspect of the present invention, it is preferable that, in the production method of the third aspect, the anodical bonding of the fixed portion and the elastically-supporting portion to the second glass package is performed in a vacuum state.

According to a fifth aspect of the present invention, it is preferable that, in the production method of the third or fourth aspect, a plurality of the first glass packages are formed in a first glass substrate in a non-separated state with a division region arranged between the first glass packages, a plurality of the second glass packages are formed in a second glass substrate in a non-separated state with a division region arranged between the second glass packages, a plurality of functional elements each including the fixed portion, the moveable portion, and the elastically-supporting portion are formed in a same substrate in a non-separated state with a division region arranged between the functional elements, and the substrate to which the first and second glass packages are anodically bonded is divided at the division regions.

According to a sixth aspect of the present invention, an electrostatic device intermediate body includes: a substrate in which a plurality of device components each including the fixed portion, the moveable portion, and the elastically-supporting portion of the electrostatic device according to the first aspect are integrally formed; and first and second glass packages that vacuum-package the substrate.

A production method according to a seventh aspect of the present invention includes performing singulation on the electrostatic device intermediate body according to the sixth aspect to produce the electrostatic device.

Advantageous Effects of Invention

According to the present invention, the size and cost of the electrostatic device can be reduced.

DESCRIPTION OF EMBODIMENTS

Figure 1:
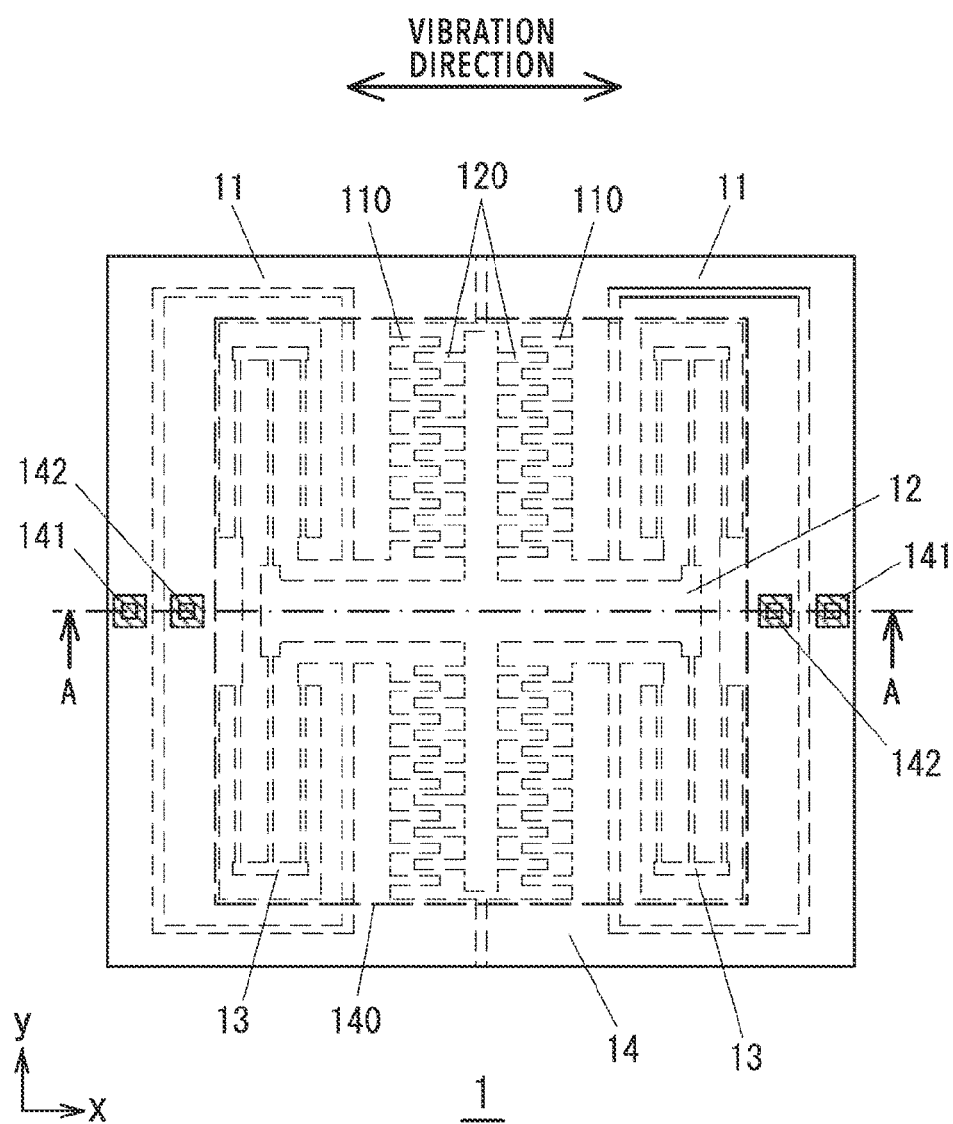
FIG. 1 is a plan view of a vibration-driven energy harvesting element.
Figure 2:
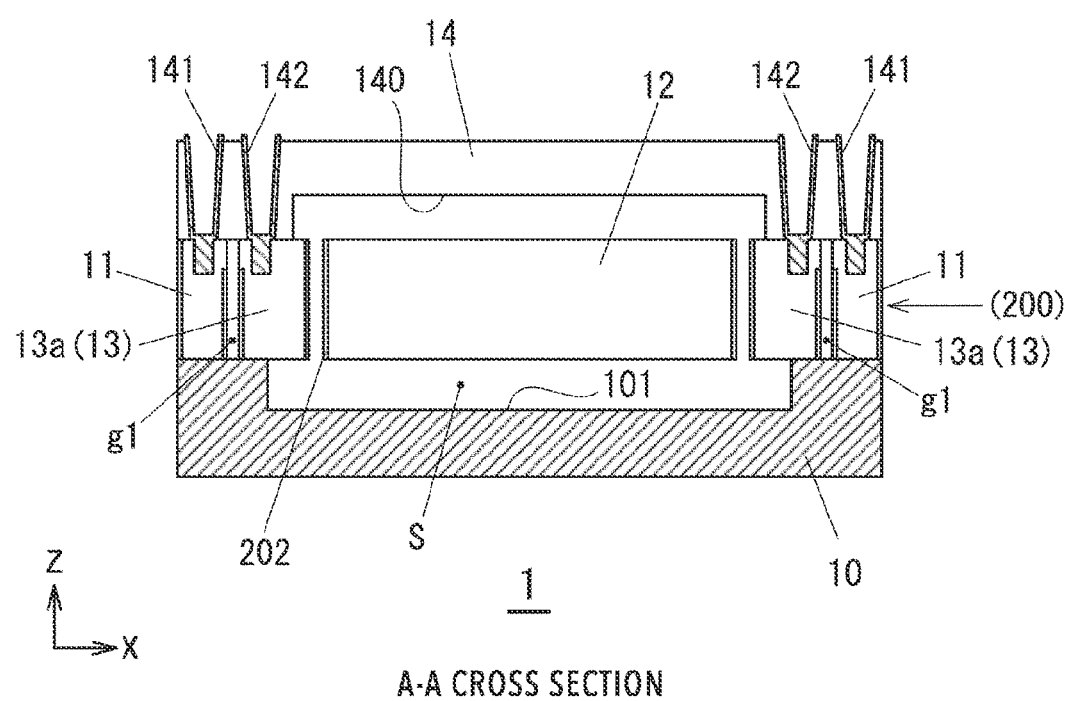
FIG. 2 is an A-A cross sectional view of FIG. 1.

An embodiment of the present invention is described below with reference to the drawings. FIGS. 1 and 2 are views illustrating an example of a vibration-driven energy harvesting element 1 that is an electrostatic device. FIG. 1 is a plan view of the vibration-driven energy harvesting element 1 and FIG. 2 is a view illustrating an A-A cross section. The vibration-driven energy harvesting element 1 includes a first glass package 10 as well as fixed portions 11, a moveable portion 12, and elastically-supporting portions 13 that are provided on the first glass package 10. The fixed portions 11, the moveable portion 12, and the elastically-supporting portions 13 are formed in a Si substrate 200 and the fixed portions 11 and fixed areas 13a of the elastically-supporting portions 13 are anodically bonded onto the first glass package 10 made of a glass substrate. Moreover, a second glass package 14 is anodically bonded onto the Si substrate 200. Note that, since the fixed portions 11, the moveable portion 12, and the elastically-supporting portions 13 are hidden below the second glass package 14, these parts are illustrated by broken lines in the plan view of FIG. 1.

Electrodes 141 connected to the fixed portions 11 and electrodes 142 connected to the elastically-supporting portions 13 are formed in the second glass package 14. The electrodes 141 penetrate the second glass package 14 and are connected to the fixed portions 11. Meanwhile, the electrodes 142 penetrate the second glass package 14 and are connected to the fixed areas 13a of the elastically-supporting portions 13.

A recess 101 is formed in a center portion of an inner peripheral surface of the first glass package 10. A recess 140 is formed at a location facing the recess 101 in the second glass package 14. The moveable portion 12 elastically supported by the elastically-supporting portions 13 is arranged in a sealed space S between the recess 140 and the recess 101. The sealed space S is in a vacuum state. Note that a region of the second glass package 14 outside a rectangular broken line illustrating the recess 140 in FIG. 1 is anodically bonded to the fixed portions 11 and the fixed areas 13a.

Figure 3:
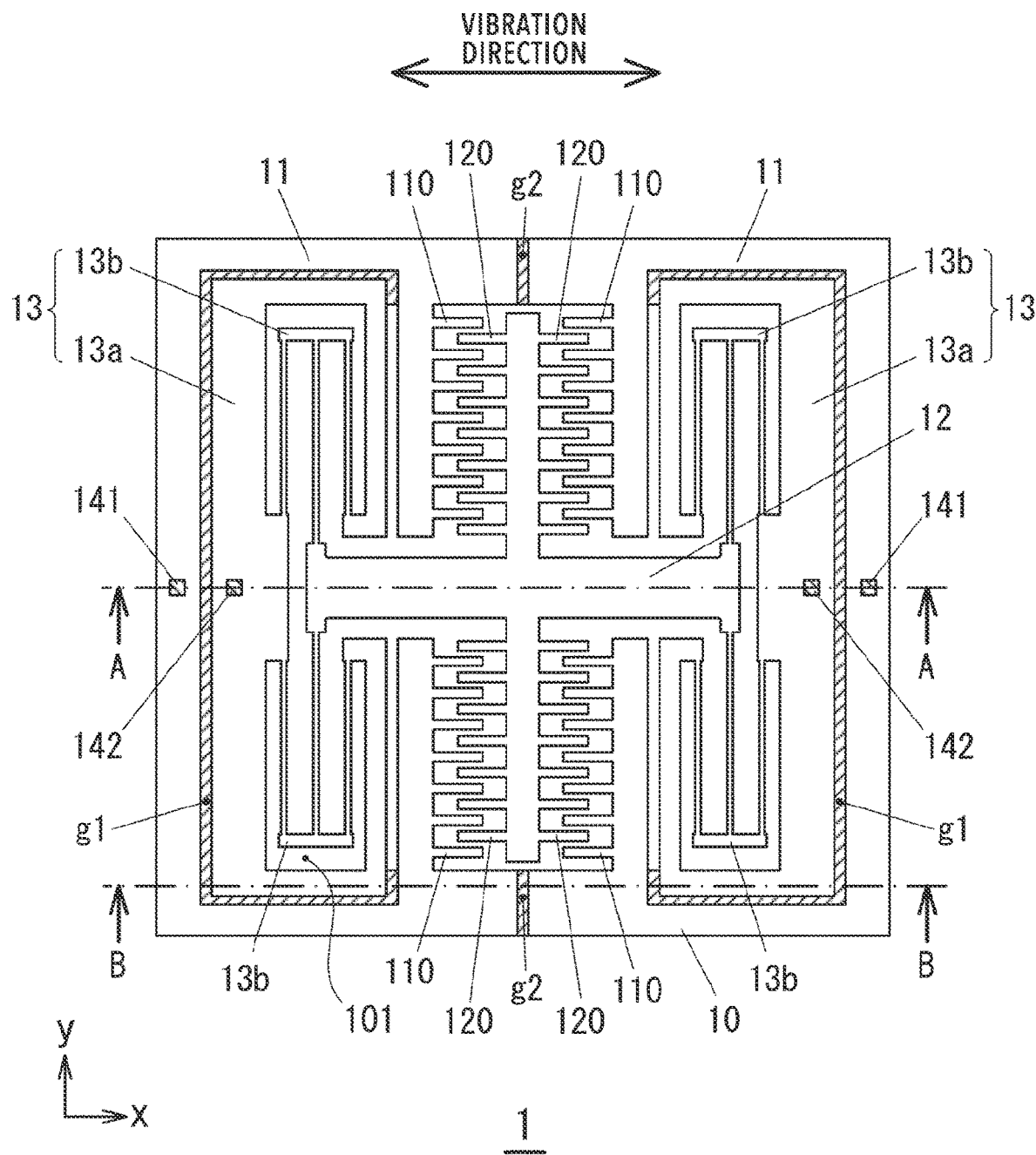
FIG. 3 illustrates a plan view of the case where a second glass package is removed in FIG. 1.

FIG. 3 illustrates a plan view of the case where the second glass package 14 of the vibration-driven energy harvesting element 1 in FIG. 1 is removed. As illustrated in FIG. 3, multiple comb electrodes 110 are formed in each of the paired left and right fixed portions 11. Multiple comb electrodes 120 are formed also in the moveable portion 12 arranged between the paired fixed portions 11. The comb electrodes 120 are arranged to face and mesh with the comb electrodes 110.

The moveable portion 12 is supported by four elastically-supporting portions 13. In the case where external force is applied to the vibration-driven energy harvesting element 1, the moveable portion 12 vibrates in a left-right direction (x direction) in the drawings. Each elastically-supporting portion 13 includes the fixed area 13a fixed onto the first glass package 10 and an elastic portion 13b linking the fixed area 13a and the moveable portion 12 to each other.

As illustrated in FIG. 2, the fixed portions 11, the moveable portion 12, and the elastically-supporting portions 13 are made from the Si substrate 200 and a $SiO_2$ film 202 is formed on surfaces of the comb electrodes 110 and 120. The $SiO_2$ film 202 contains ions of an alkali metal such as potassium and electrets are formed in the $SiO_2$ films 202. The electrets are formed in at least one of the set of comb electrodes 110 and the set of comb electrodes 120 and power is generated by a change in meshing amount between the comb electrodes 110 and the comb electrodes 120 caused by vibration of the moveable portion 12 in the left-right direction in the drawings. The generated power is outputted via the electrodes 141 and 142.

The fixed portions 11 and the fixed areas 13a are separated from one another by separation grooves g1 and the fixed portions 11 are electrically insulated from the elastically-supporting portions 13 and the moveable portion 12. Note that separation grooves g2 illustrated in FIG. 3 are grooves for electrically separating the paired left and right fixed portions 11 from each other.

(Production Method of Vibration-Driven Energy Harvesting Element 1)

Figure 4:
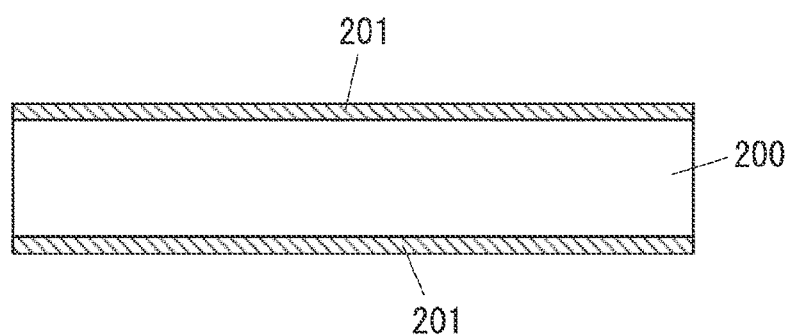
FIG. 4 is a view for explaining a first step.
Figure 5:
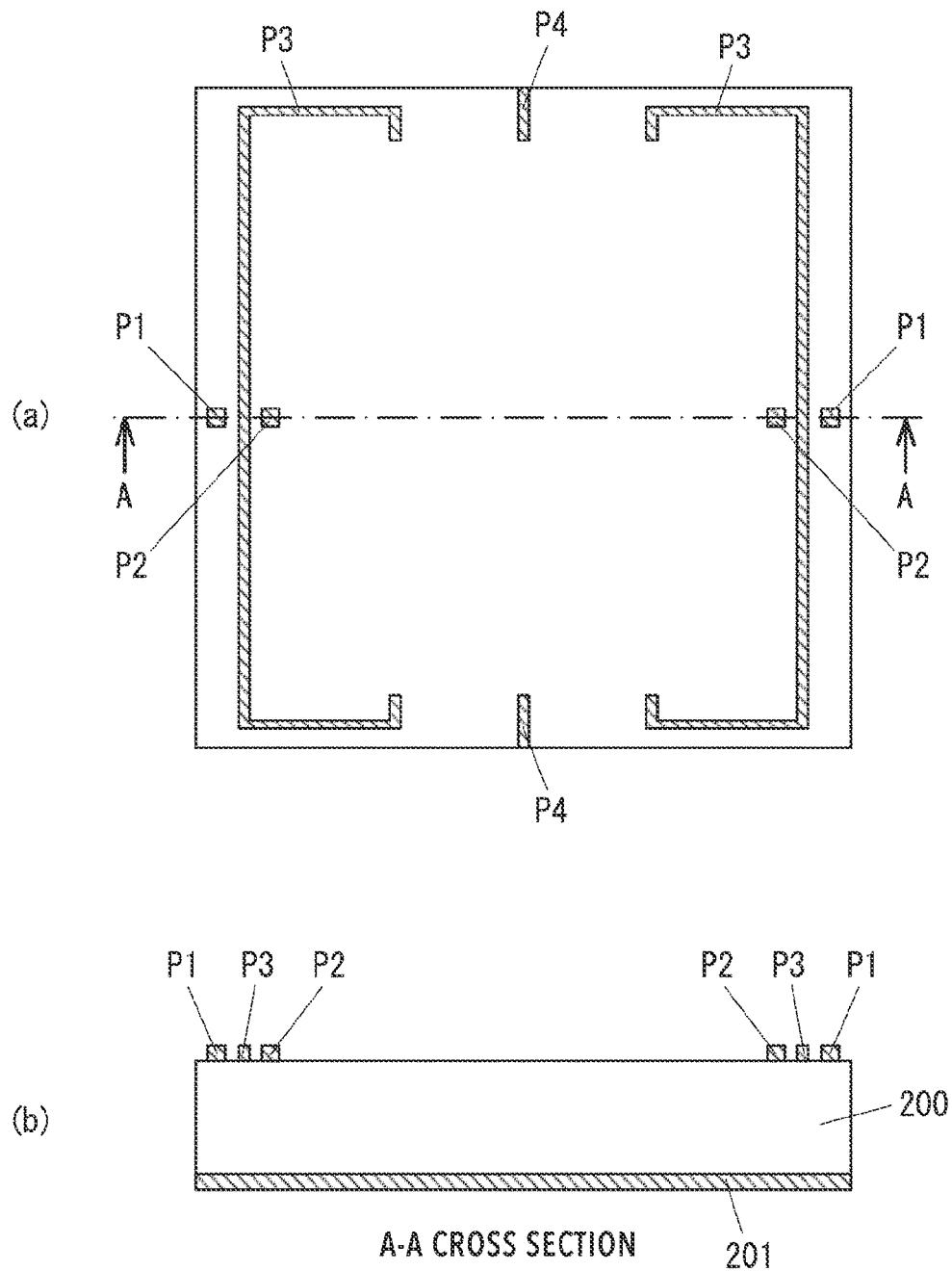
FIG. 5 is a view for explaining a second step.

FIGS. 4 to 20 are views illustrating an example of a production procedure of the vibration-driven energy harvesting element 1. In a first step illustrated in FIG. 4, SiN films 201 are formed on both of front and back surfaces of the Si substrate 200 by LP-CVD. FIG. 5 is a view for explaining a second step, FIG. 5(a) is a plan view, and FIG. 5(b) is an A-A cross-sectional view. In the second step, the SiN film 201 on the front surface is etched by dry etching to form patterns P1 and P2 for forming holes (holes 111 and 131 in FIG. 14(a) to be described later) in which the electrodes 141 and 142 are to be formed and patterns P3 and P4 for forming the separation grooves g1 and g2.

Figure 6:
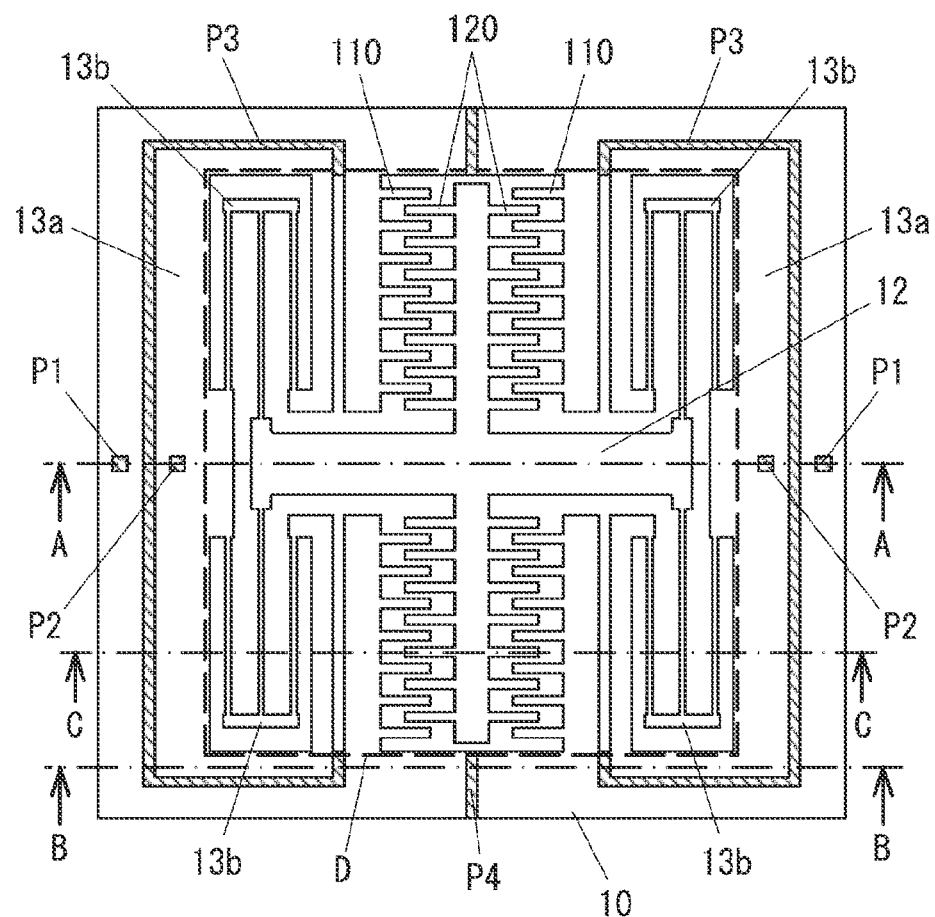
FIG. 6 is a view for explaining a third step.
Figure 7:
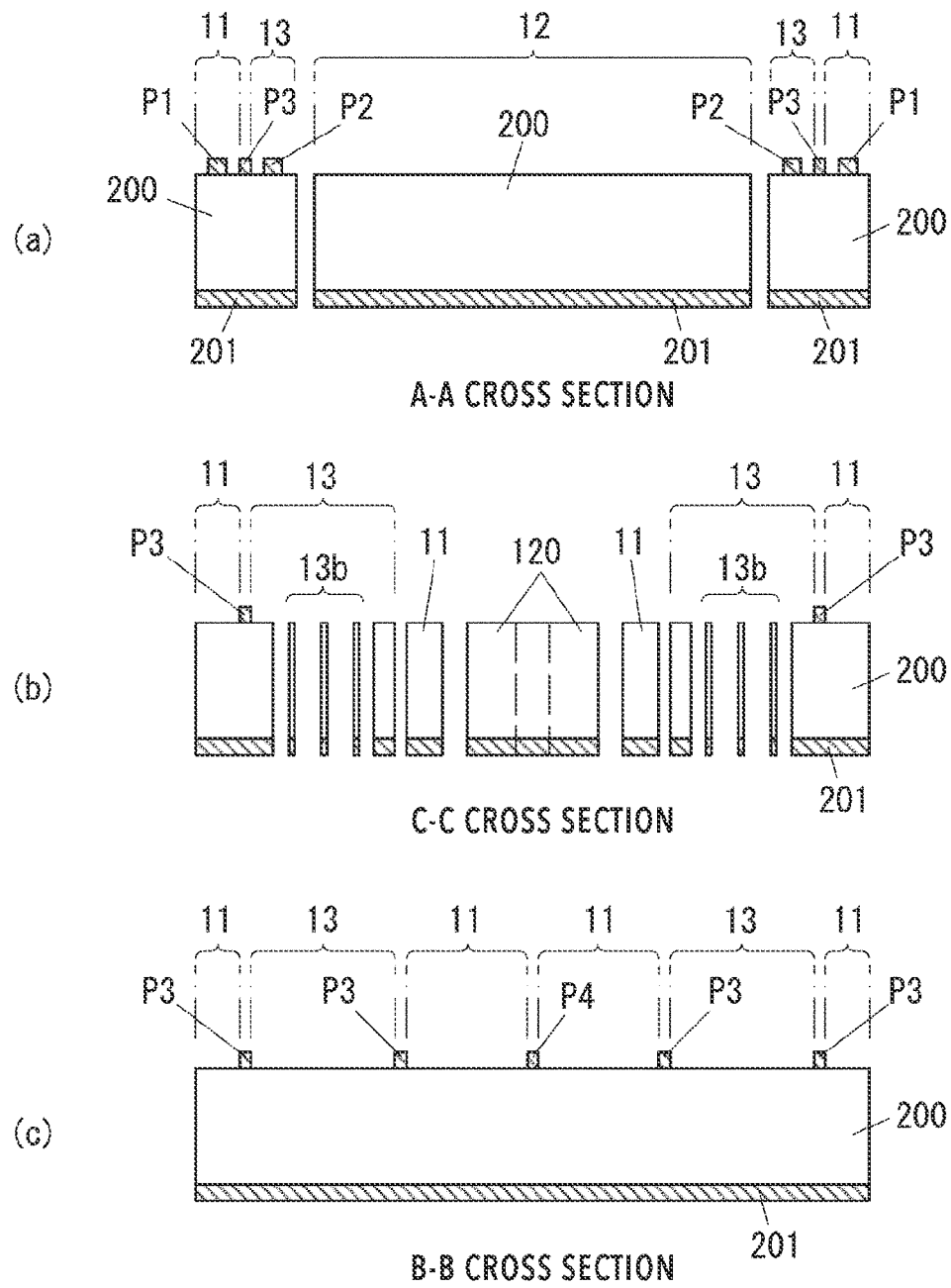
FIG. 7 is a view for explaining the third step.

FIGS. 6 and 7 are views for explaining a third step, FIG. 6 illustrates a plan view, FIG. 7(a) illustrates an A-A cross-sectional view, FIG. 7(b) illustrates a C-C cross-sectional view, and FIG. 7(c) illustrates a B-B cross-sectional view. In the third step, an Al (aluminum) mask pattern (not illustrated) for forming the fixed portions 11, the moveable portion 12, and the elastically-supporting portions 13 is formed on the front surface of the Si substrate 200 and etching is performed by Deep-RIE using this Al mask pattern such that etched portions penetrate the Si substrate 200 and the SiN films 201. Structures of the fixed portions 11, the moveable portion 12, and the elastically-supporting portions 13 that are included in a region D illustrated in FIG. 6 are formed by this etching. Specifically, there are formed the elastically-supporting portions 13 and portions of the fixed portions 11 and the moveable portion 12 in which the comb electrodes 110 and 210 are formed. The region D of FIG. 6 illustrates a region which the recess portion 140 of FIG. 2 faces.

Figure 8:
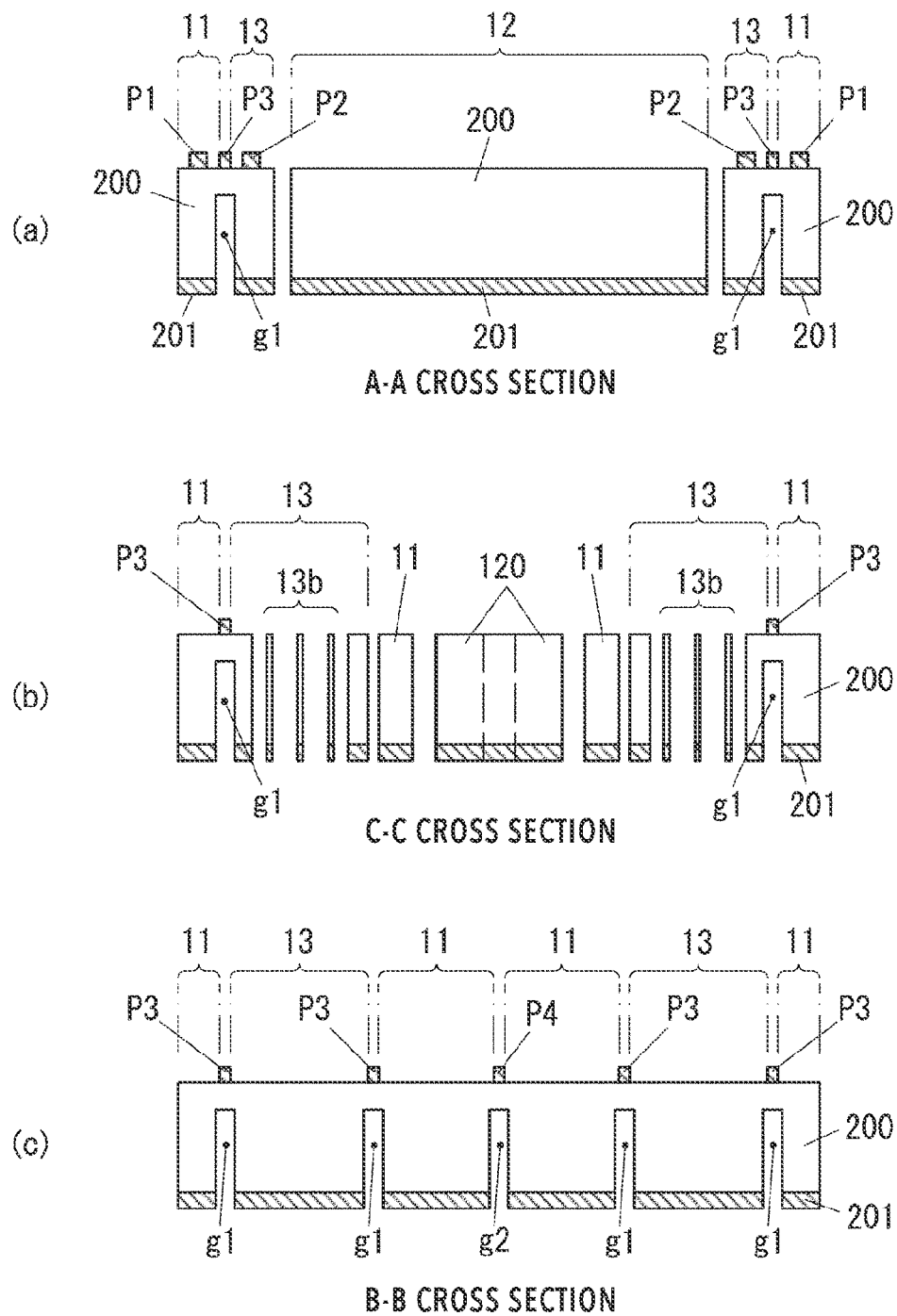
FIG. 8 is a view for explaining a fourth step.

FIG. 8 is a view for explaining a fourth step, FIG. 8(a) illustrates an A-A cross-sectional view, FIG. 8(b) illustrates a C-C cross-sectional view, and FIG. 8(c) illustrates a B-B cross-sectional view. In the fourth step, etching for forming the separation grooves g1 and g2 is performed by Deep-RIE. The separation grooves g1 and g2 are formed at positions of the patterns P3 and P4 (see FIG. 5). Note that, in the fourth step, complete separation with the separation grooves g1 and g2 is not performed and etching is performed from the back surface of the substrate to such depth that integrity of the entire Si substrate 200 is maintained (so-called half etching).

Figure 9:
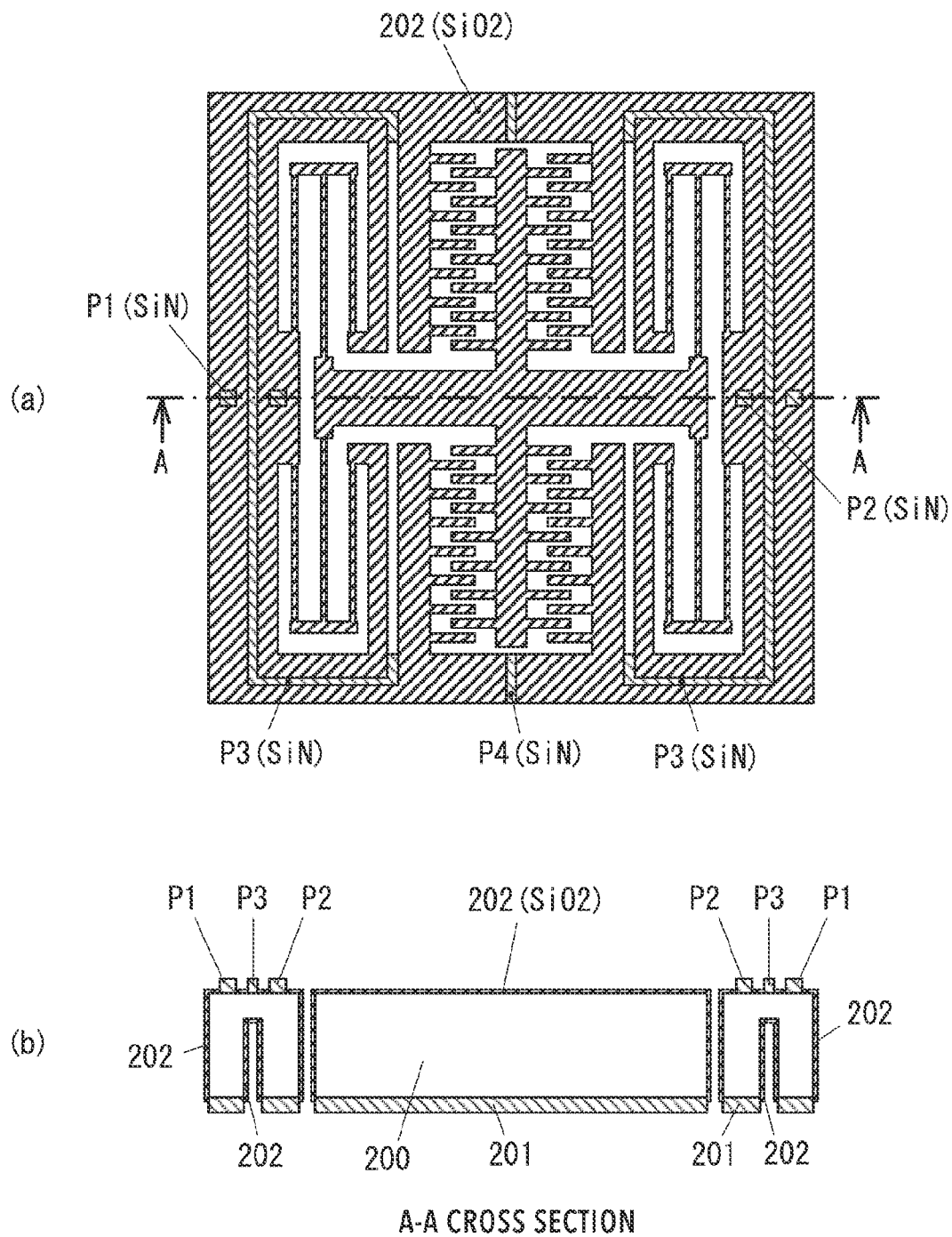
FIG. 9 is a view for explaining a fifth step.

FIG. 9 is a view for explaining a fifth step, FIG. 9(a) illustrates a plan view, and FIG. 9(b) illustrates an A-A cross-sectional view. In the fifth step, the SiO$_2$ film 202 containing ions of alkali metal such as potassium is formed on an exposed surface of the Si substrate 200.

Figure 10:
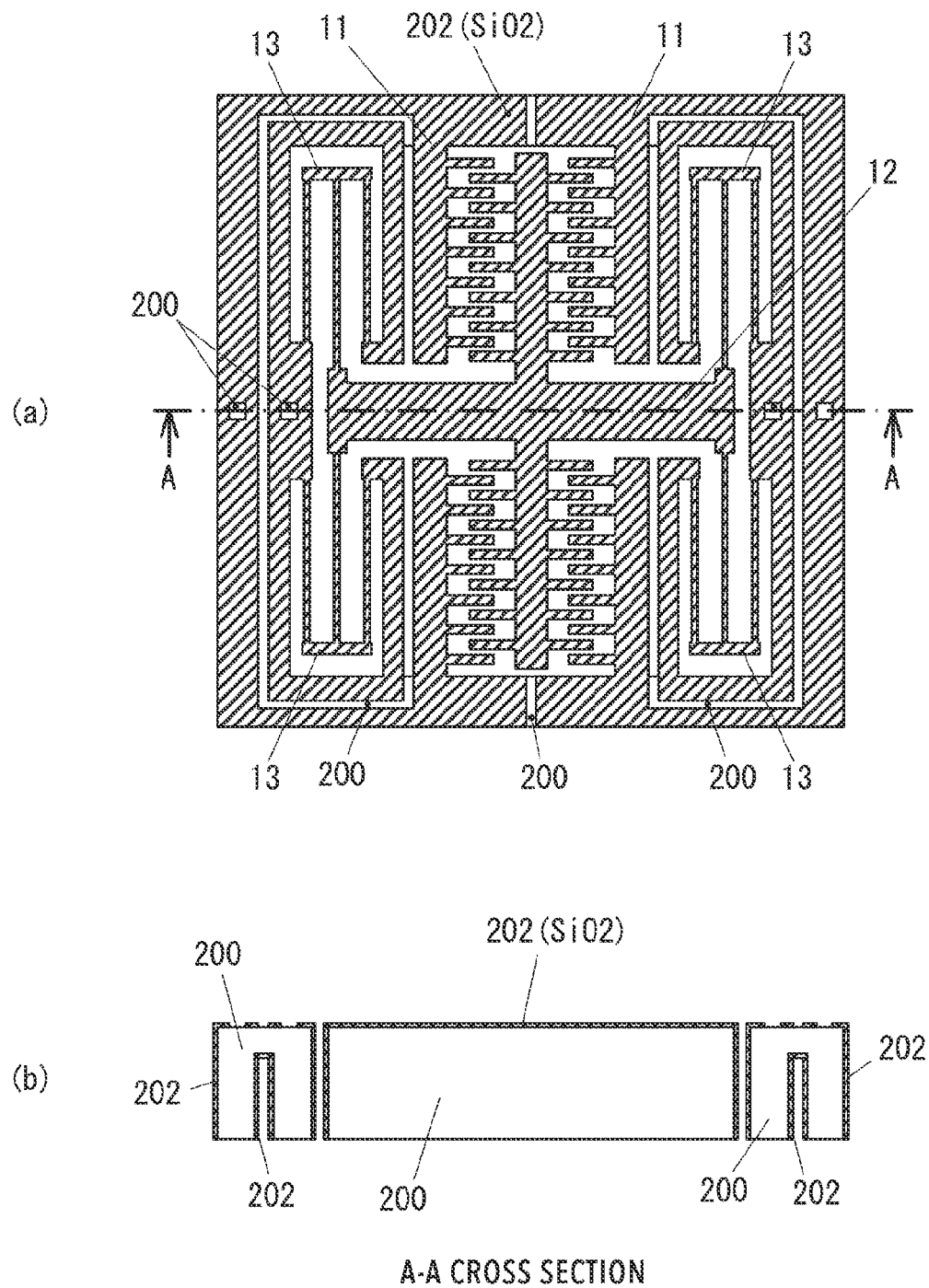
FIG. 10 is a view for explaining a sixth step.

FIG. 10 is a view for explaining a sixth step, FIG. 10(a) illustrates a plan view, and FIG. 10(b) illustrates an A-A cross-sectional view. In the sixth step, first, the SiN film 201 on the back surface of the substrate is removed by RIE using CF$_4$ gas. Similarly, the SiN film 201 on the front surface of the substrate is removed.

Figure 11:
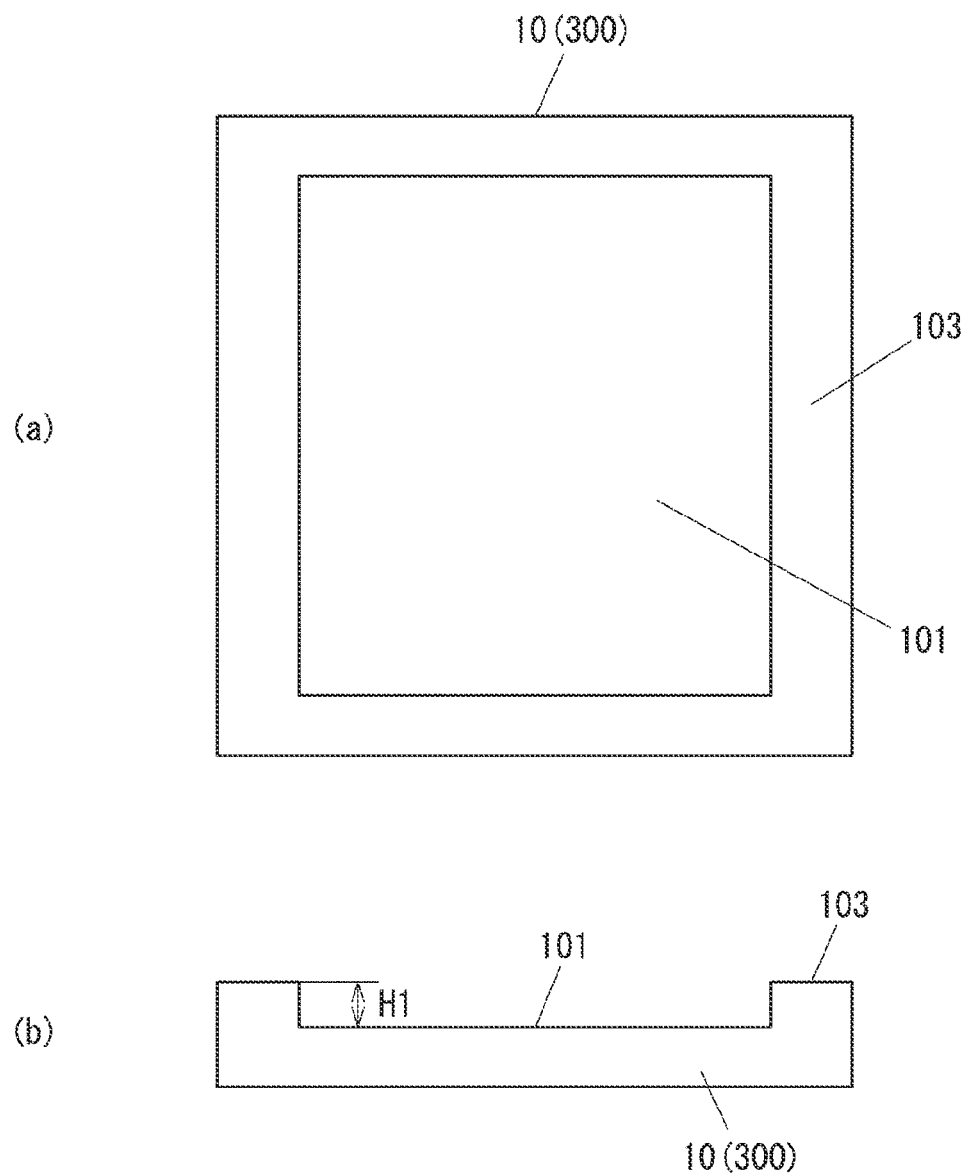
FIG. 11 is a view for explaining a seventh step.

FIG. 11 is a view explaining a seventh step, FIG. 11(a) illustrates a plan view, and FIG. 11(b) illustrates a cross-sectional view. In the seventh step, the recess portion 101 is formed in a glass substrate 300 used to form the first glass package 10. A step dimension H1 between a bottom surface of the recess portion 101 and an end surface of a frame portion 103 is set to such a dimension that the vibrating moveable portion 12 may not cause interference when vibrating (for example, several tens of μm). A glass substrate used in anodical bonding (for example, a glass substrate containing sodium) is used as the glass substrate 300.

Figure 12:
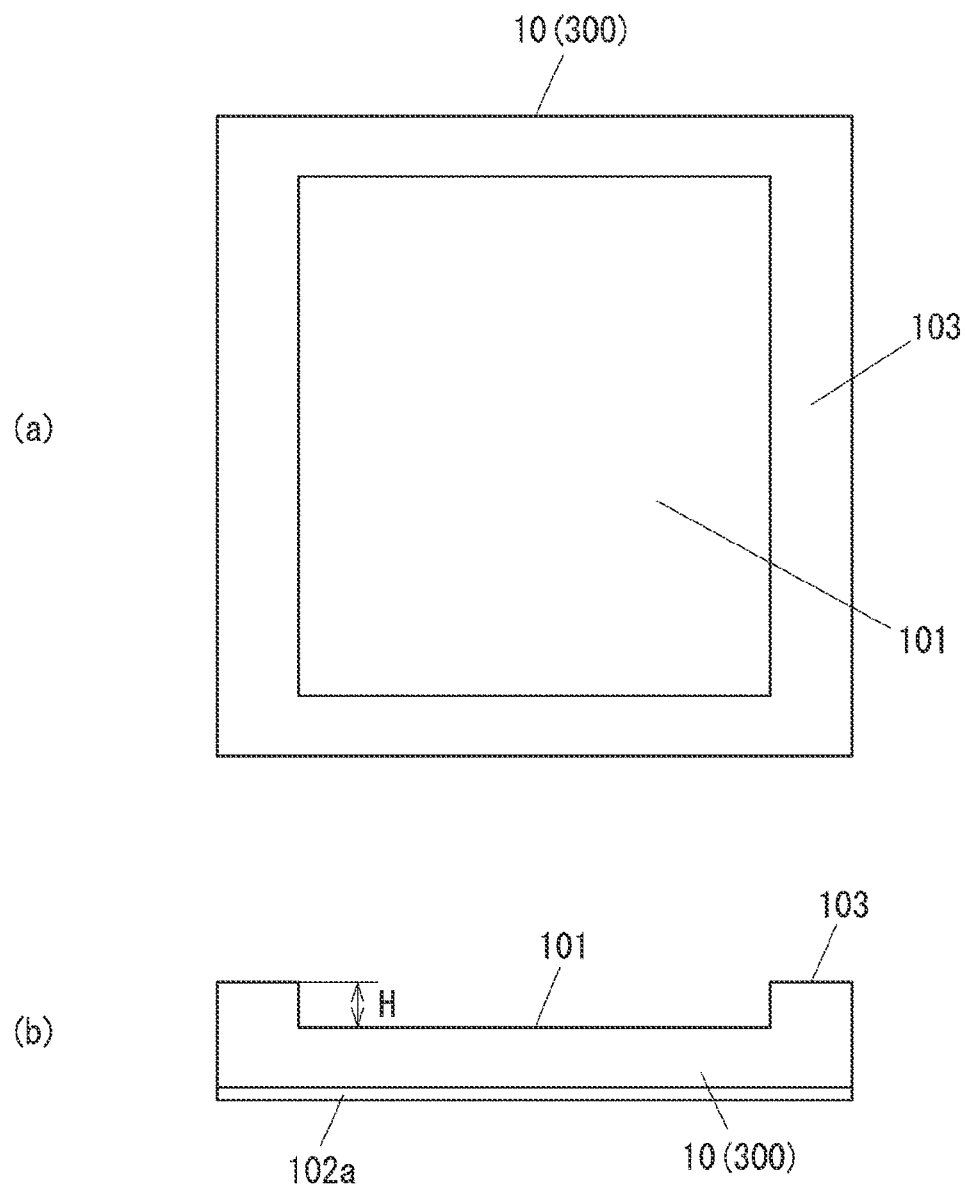
FIG. 12 is a view for explaining an eighth step.

FIG. 12 is a view for explaining an eighth step, FIG. 12(a) illustrates a plan view, and FIG. 12(b) illustrates a cross-sectional view. In the eighth step, a metal layer 102a such as a vapor-deposited aluminum film is formed on a back surface of the first glass package 10. Note that the metal layer 102a on the back surface is formed to disperse electric field over the entire surface of the glass substrate 300 in an anodical bonding process. However, since anodical bonding is possible without the metal layer 102a, the metal layer 102a is not essential.

Figure 13:
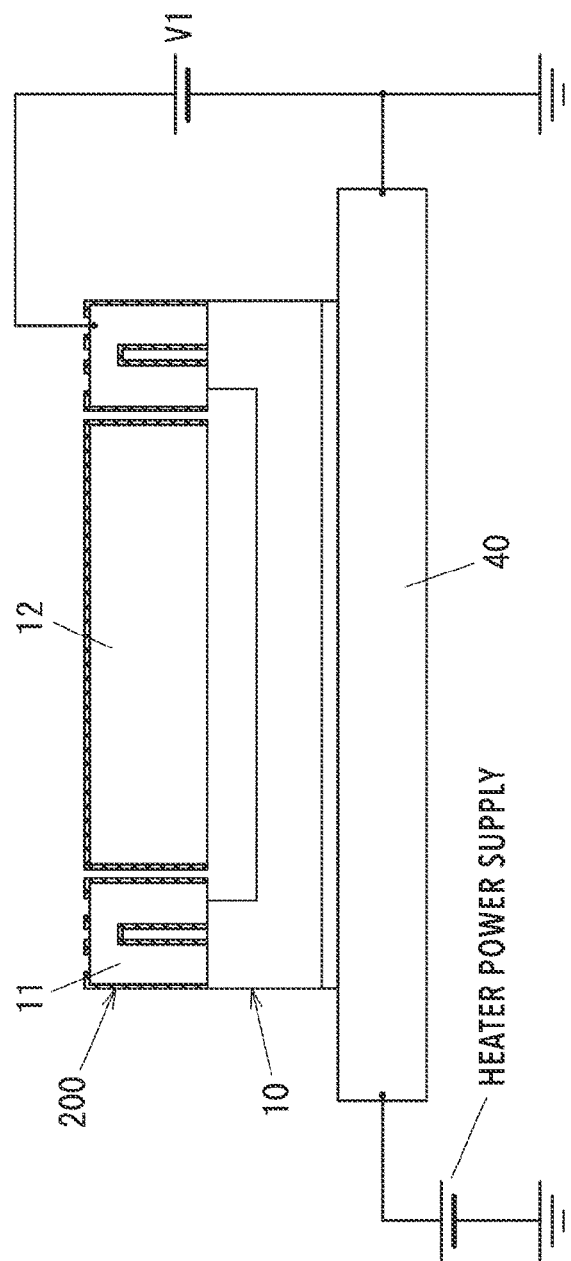
FIG. 13 is a view for explaining a ninth step.

In a ninth step illustrated in FIG. 13, the first glass package 10 made of the glass substrate illustrated in FIG. 12 is anodically bonded to the back surface of the Si substrate 200 (see FIG. 10) in which the fixed portions 11, the moveable portion 12, and the elastically-supporting portions 13 are formed. The first glass package 10 is placed on a heater 40 and the Si substrate 200 in which the fixed portions 11, the moveable portion 12, and the elastically-supporting portions 13 are formed is stacked on the first glass package 10. The temperature of the heater 40 is set to temperature at which thermal diffusion of sodium ions in the glass substrate becomes sufficiently active (for example, 500° C. or higher). Anodical bonding voltage, that is voltage V1 of the Si substrate 200 based on the heater 40 is set to, for example, 400 V or higher.

In the case where a silicon substrate (Si substrate 200) and a glass substrate (first glass package 10) are anodically bonded to each other, DC voltage of about several hundreds of V is applied to a laminated body of the silicon substrate and the glass substrate with the silicon substrate side being the anode while the laminated body is heated. Sodium ions in the glass substrate move to the negative potential side and a space charge layer of SiO$^-$ (layer depleted of sodium ions) is formed on the glass substrate side of a bonding surface between the glass substrate and the silicon substrate. As a result, the glass substrate and the silicon substrate are bonded to each other by electrostatic attraction.

Figure 14:
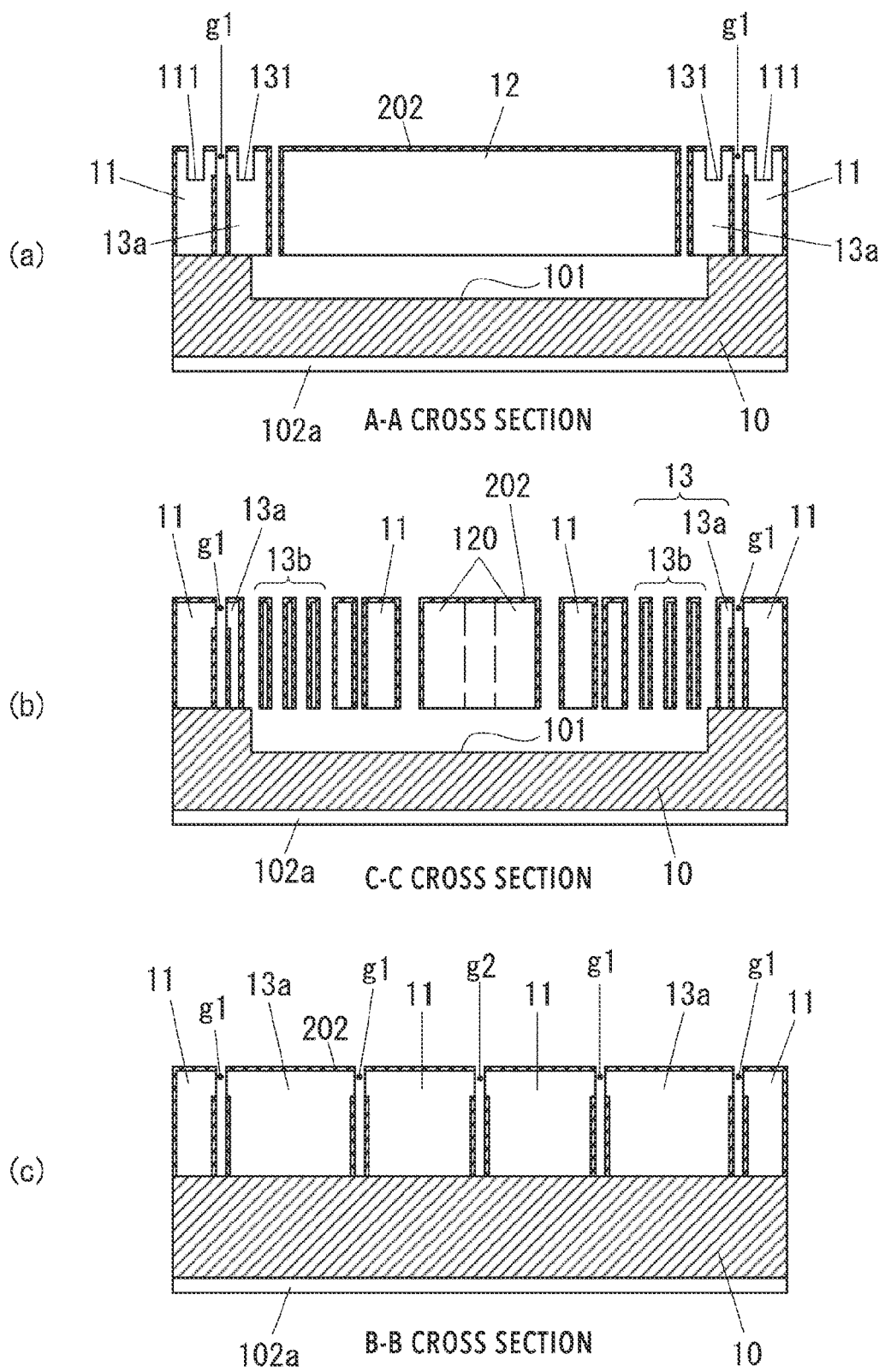
FIG. 14 is a view for explaining a tenth step.

FIG. 14 is a view for explaining a tenth step, FIG. 14(a) illustrates an A-A cross-sectional view, FIG. 14(b) illustrates a C-C cross-sectional view, and FIG. 14(c) illustrates a B-B cross-sectional view. In the tenth step, the Si substrate 200 anodically bonded to the first glass package 10 is etched to the middle by Deep-RIE to achieve a state where the non-penetrating separation grooves g1 and g2 illustrated in FIG. 8 penetrate the Si substrate 200 from the front surface to the back surface thereof. The fixed portions 11 and the elastically-supporting portions 13 elastically supporting the moveable portion 12 are thereby completely separated from each other. Moreover, this etching not only causes the separation grooves g1 and g2 to penetrate the Si substrate 200 but also forms the holes 111 and 131 in which the electrodes 141 and 142 are to be formed.

Figure 15:
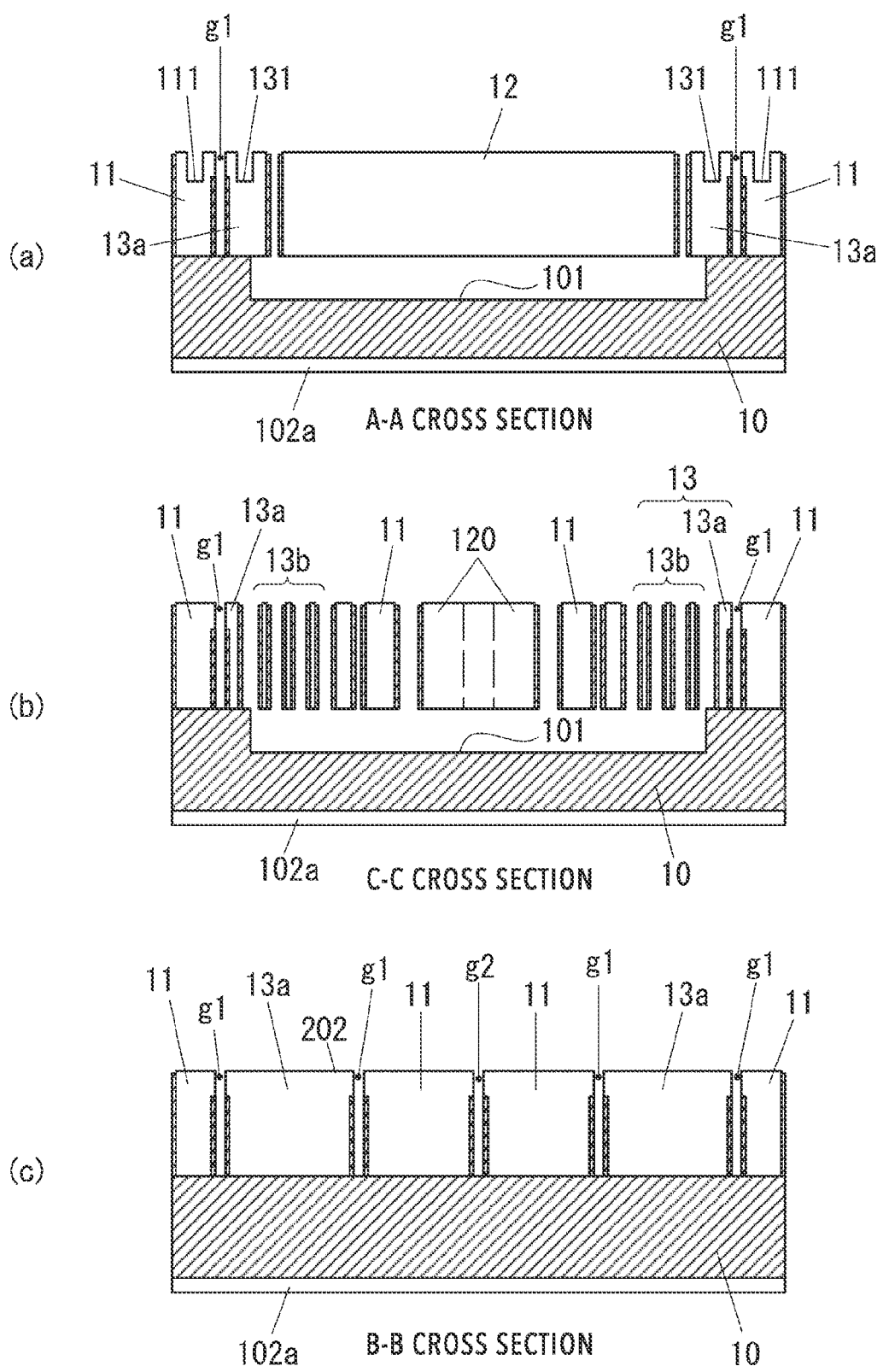
FIG. 15 is a view for explaining an eleventh step.

FIG. 15 is a view for explaining an eleventh step, FIG. 15(a) illustrates an A-A cross-sectional view, FIG. 15(b) illustrates a C-C cross-sectional view, and FIG. 15(c) illustrates a B-B cross-sectional view. In the eleventh step, the SiO$_2$ films 202 (see FIG. 14) containing ions of alkali metal and formed on the front surface of the Si substrate 200 in which the fixed portions 11, the moveable portion 12, and the elastically-supporting portions 13 are formed is removed by dry etching.

Figure 16:
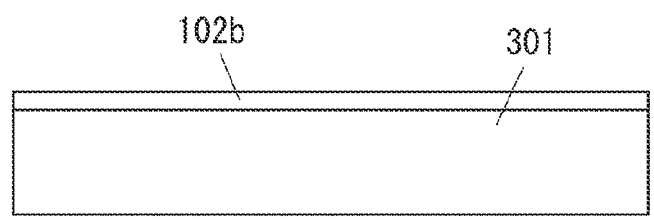
FIG. 16 is a view for explaining a twelfth step.

FIG. 16 is a view for explaining a twelfth step and illustrates a cross-sectional view. In the twelfth step, a metal layer 102b such as vapor-deposited aluminum film is formed on a front surface of a glass substrate 301 used to form the second glass package 14. The metal layer 102b is formed for the same purpose as that for the metal layer 102a of the first glass package 10 illustrated in FIG. 12. A glass substrate used in anodical bonding (for example, a glass substrate containing sodium) is used as the glass substrate 301 like the glass substrate 300.

Figure 17:
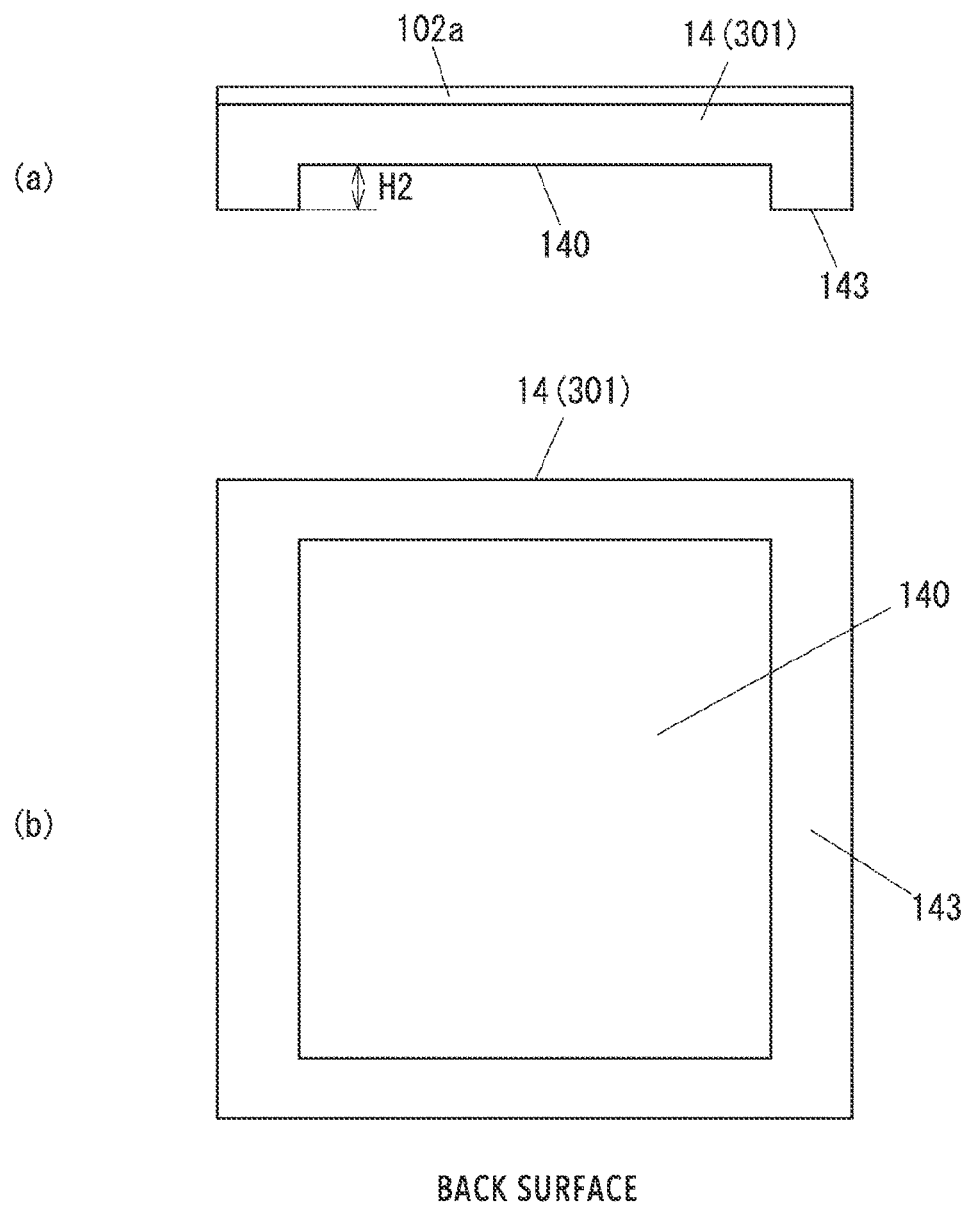
FIG. 17 is a view for explaining a thirteenth step.

FIG. 17 is a view for explaining an thirteenth step, FIG. 17(a) illustrates a cross-sectional view, and FIG. 17(b) is a view illustrating the back surface side of the substrate illustrated in FIG. 17(a). In the thirteenth step, the recess portion 140 is formed in the glass substrate 301 to form the second glass package 14. A step dimension H2 between a bottom surface of the recess portion 140 and an end surface of a frame portion 143 is set to such a dimension that the vibrating moveable portion 12 may not cause interference when vibrating (for example, several tens of μm).

Figure 18:
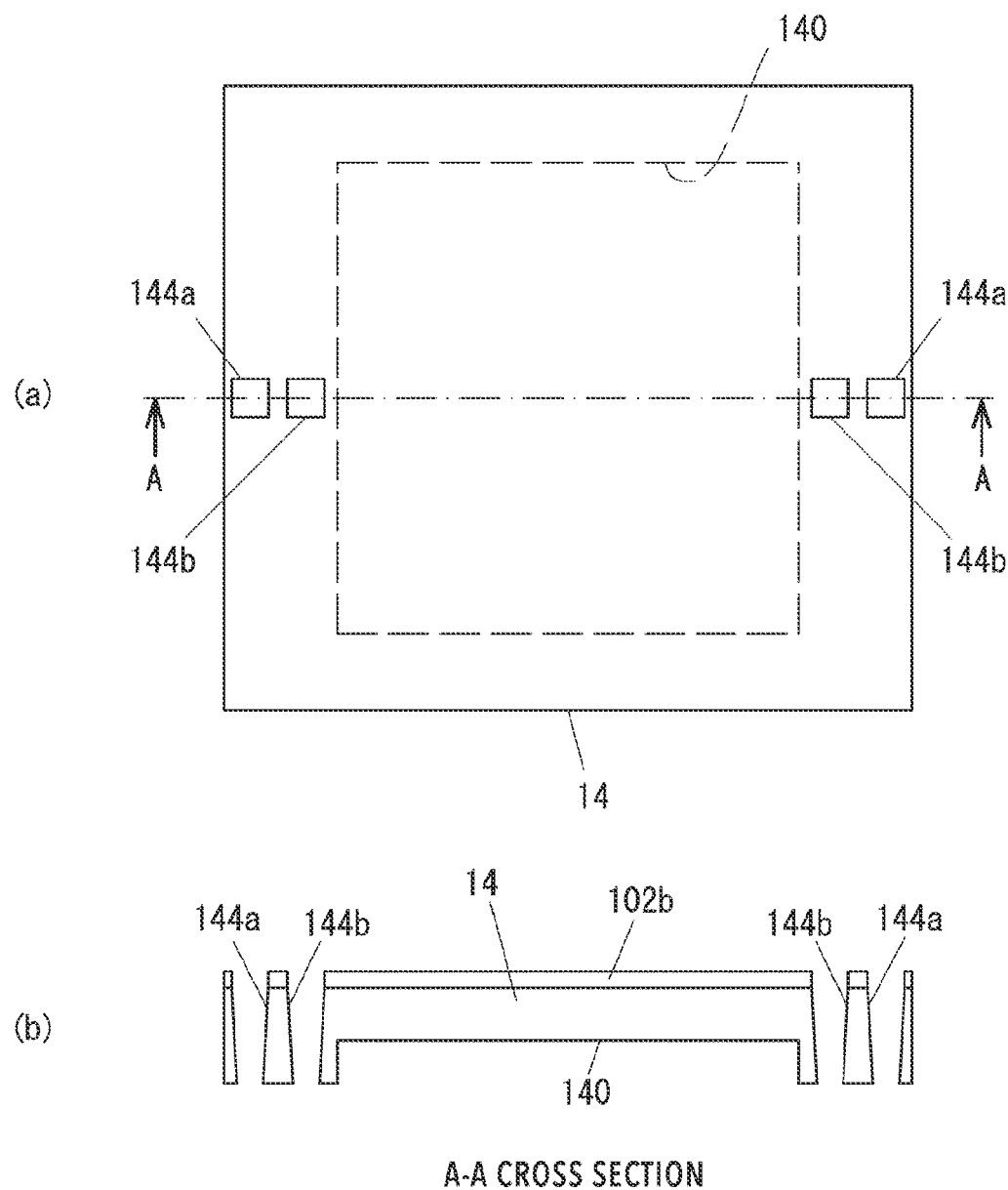
FIG. 18 is a view for explaining a fourteenth step.

FIG. 18 is a view for explaining a fourteenth step, FIG. 18(*a*) illustrates a plan view, and FIG. 18(*b*) illustrates a cross-sectional view. In the fourteenth step, through holes 144*a* and 144*b* for forming the electrodes 141 and 142 are formed in the second glass package 14 illustrated in FIG. 17 by sand blasting.

Figure 19:
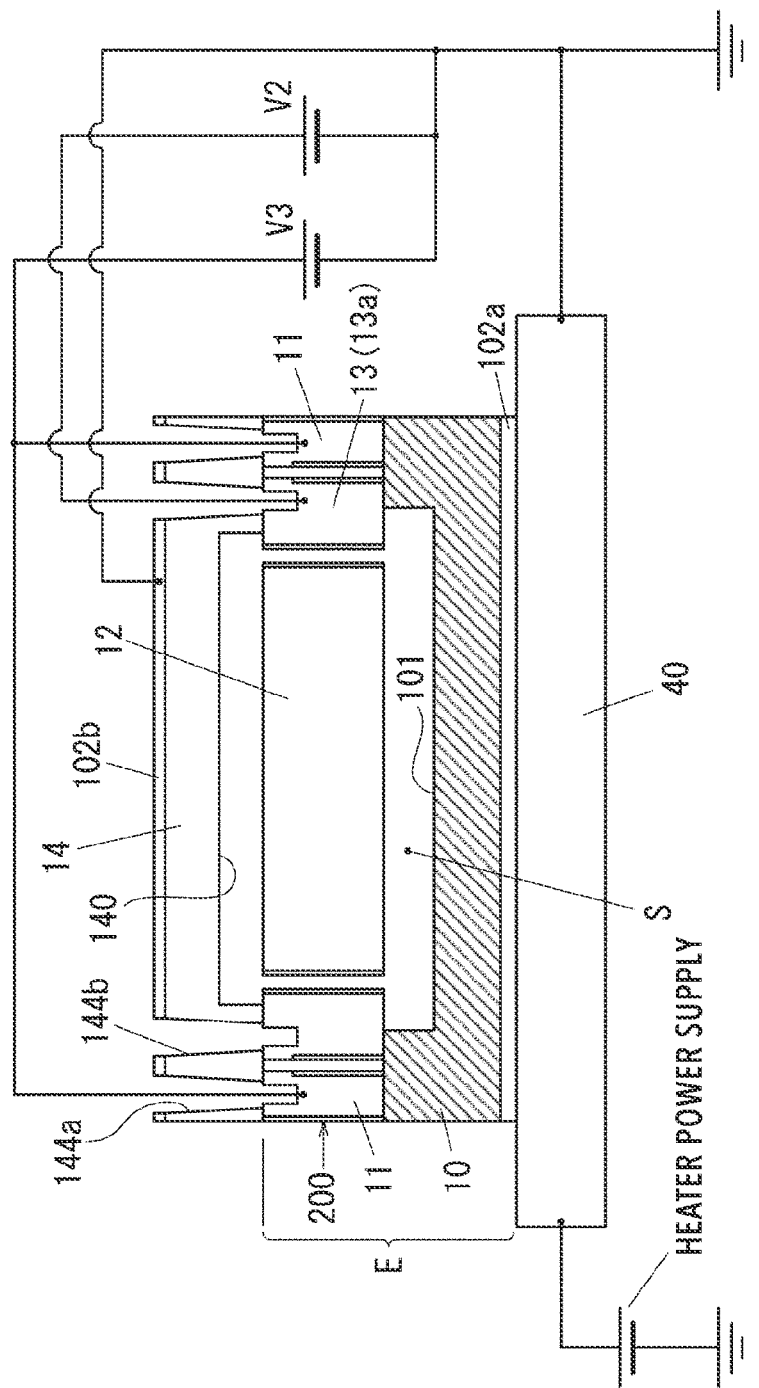
FIG. 19 is a view for explaining a fifteenth step.

In a fifteenth step illustrated in FIG. 19, the second glass package 14 illustrated in FIG. 18 is anodically bonded onto a component E that is illustrated in FIG. 15 and that is obtained by anodically bonding the first glass package 10 and the Si substrate 200 in which the fixed portions 11, the moveable portion 12, and the elastically-supporting portions 13 are formed. Moreover, the comb electrodes 110 and 120 are formed into electrets simultaneously with this anodical bonding.

As illustrated in FIG. 19, the component E is placed on the heater 40 with the first glass package 10 on the lower side and the second glass package 14 illustrated in FIG. 18 is stacked on the Si substrate 200 of the component E. Then, voltage of the elastically-supporting portions 13 and the moveable portion 12 based on the heater 40 is set to V2 and voltage of the fixed portions 11 based on the heater 40 is set to V3. In order to simultaneously perform the anodical bonding of the Si substrate 200 and the second glass package 14 and the electret formation of the comb electrodes 110 and 120, the voltage V2 required for the anodical bonding is applied between the second glass package 14 and the Si substrate 200 and voltage (V3−V2) required for the electret formation is applied between the moveable portion 12 and the fixed portions 11. For example, V2 is set to 400 V and V3 is set to 700 V. The temperature of the heater 40 is set to temperature (for example, 500° C. or higher) required for the anodical bonding and the electret formation.

The anodical bonding operation illustrated in FIG. 19 is performed in a vacuum chamber. As a result, the sealed space S between the recess portion 140 and the recess portion 101 after the anodical bonding is in a vacuum state.

Figure 20:
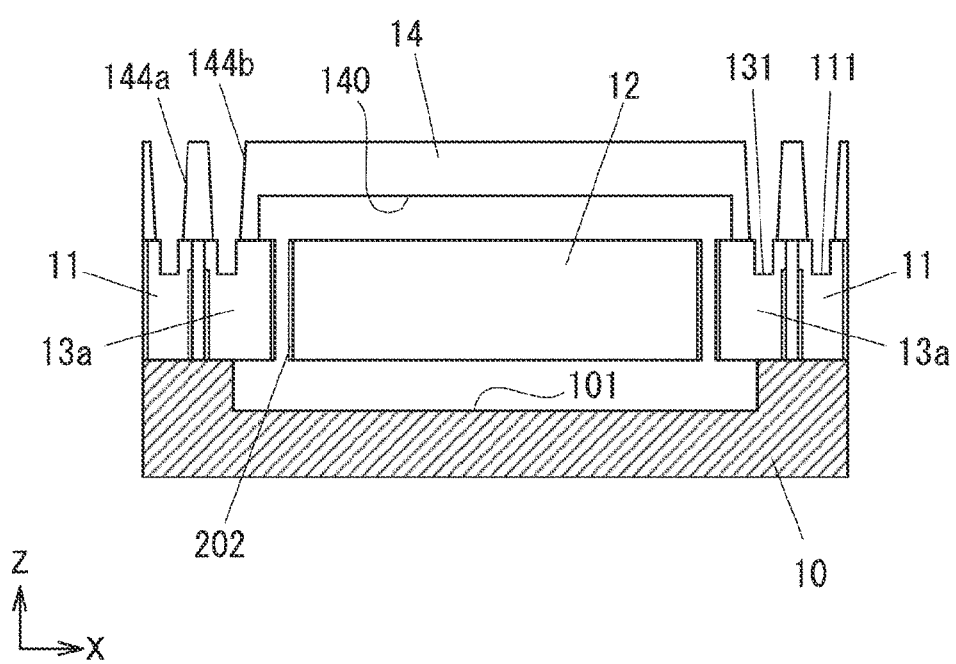
FIG. 20 is a view for explaining a sixteenth step.

In a sixteenth step illustrated in FIG. 20, after the anodical bonding as illustrated in FIG. 19, the metal layer 102*a* formed on the lower surface of the first glass package 10 and the metal layer 102*b* formed on the upper surface of the second glass package 14 are removed by wet etching. As illustrated in FIG. 20, the holes 111 of the fixed portions 11 communicate with the through holes 144*a* of the second glass package 14 and the holes 131 formed in the fixed areas 13*a* of the elastically-supporting portions 13 communicate with the through holes 144*b* of the second glass package 14.

Next, in a seventeenth step, metal films are formed in regions of the holes 111 and 131 and the through holes 144*a* and 144*b* illustrated in FIG. 20 by sputtering, vapor deposition, or the like to form the electrodes 141 and 142 illustrated in FIG. 3. The electrodes 141 are formed in the regions of the holes 111 and the through holes 144*a* and the electrodes 142 are formed in the regions of the holes 131 and the through holes 144*b*. The vibration-driven energy harvesting element 1 is thus completed.

Figure 21:
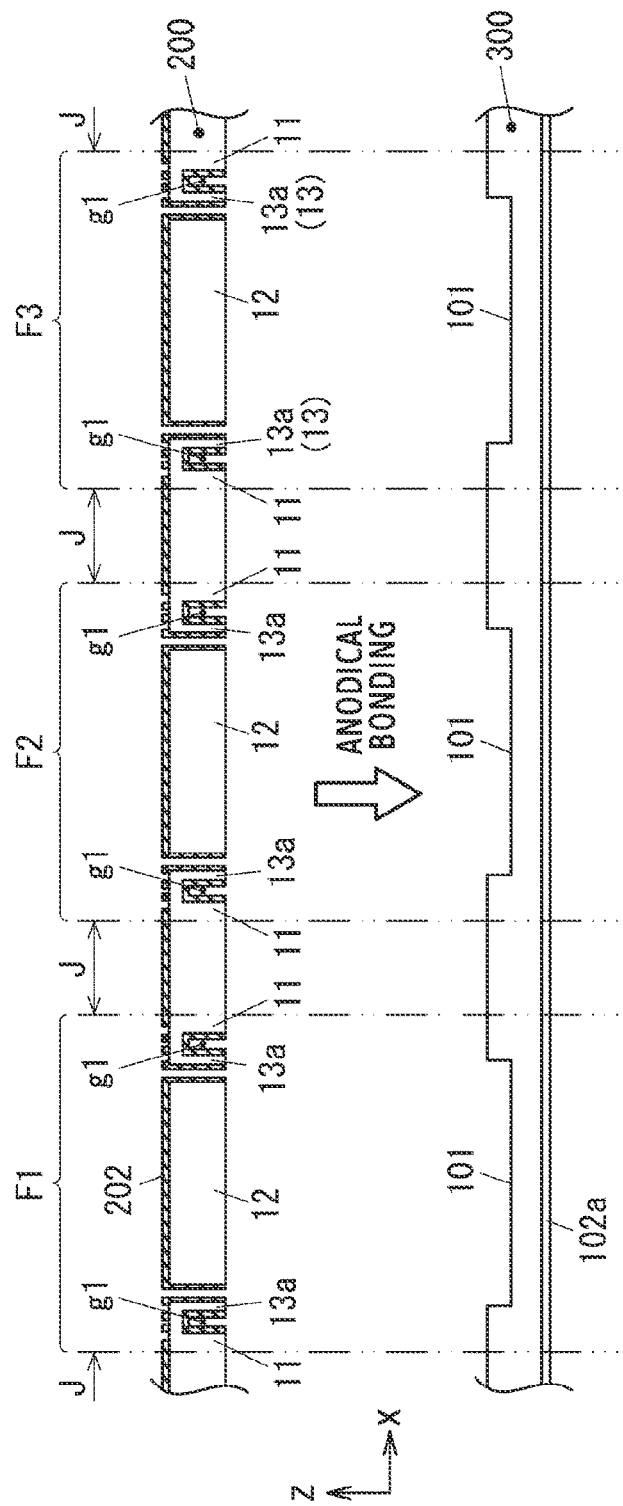
FIG. 21 is a view for explaining an anodical bonding step of a Si substrate and a glass substrate on the lower side in the case where multiple vibration-driven energy harvesting elements are collectively formed at a wafer level.
Figure 22:
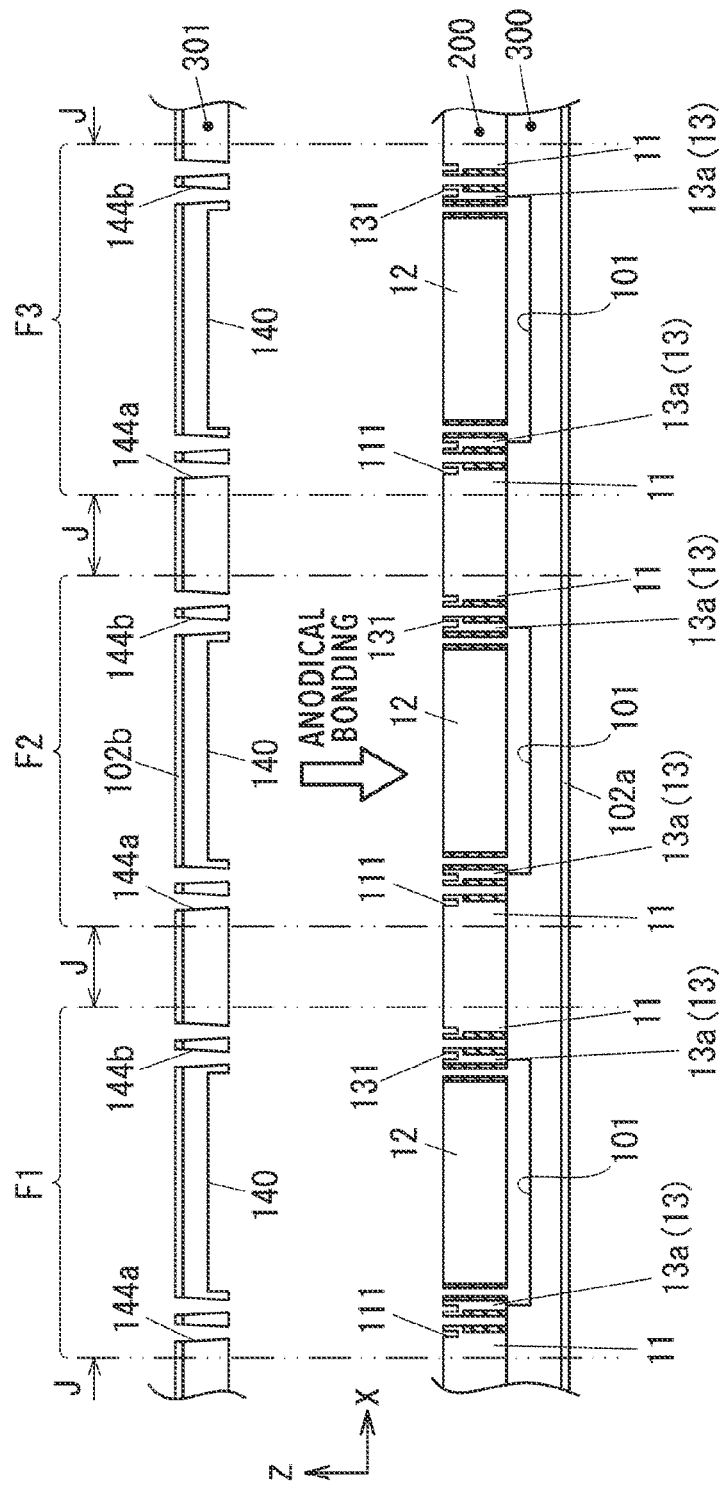
FIG. 22 is a view for explaining an anodical bonding step of a glass substrate on the upper side in the case where multiple vibration-driven energy harvesting elements are collectively formed at a wafer level.
Figure 23:
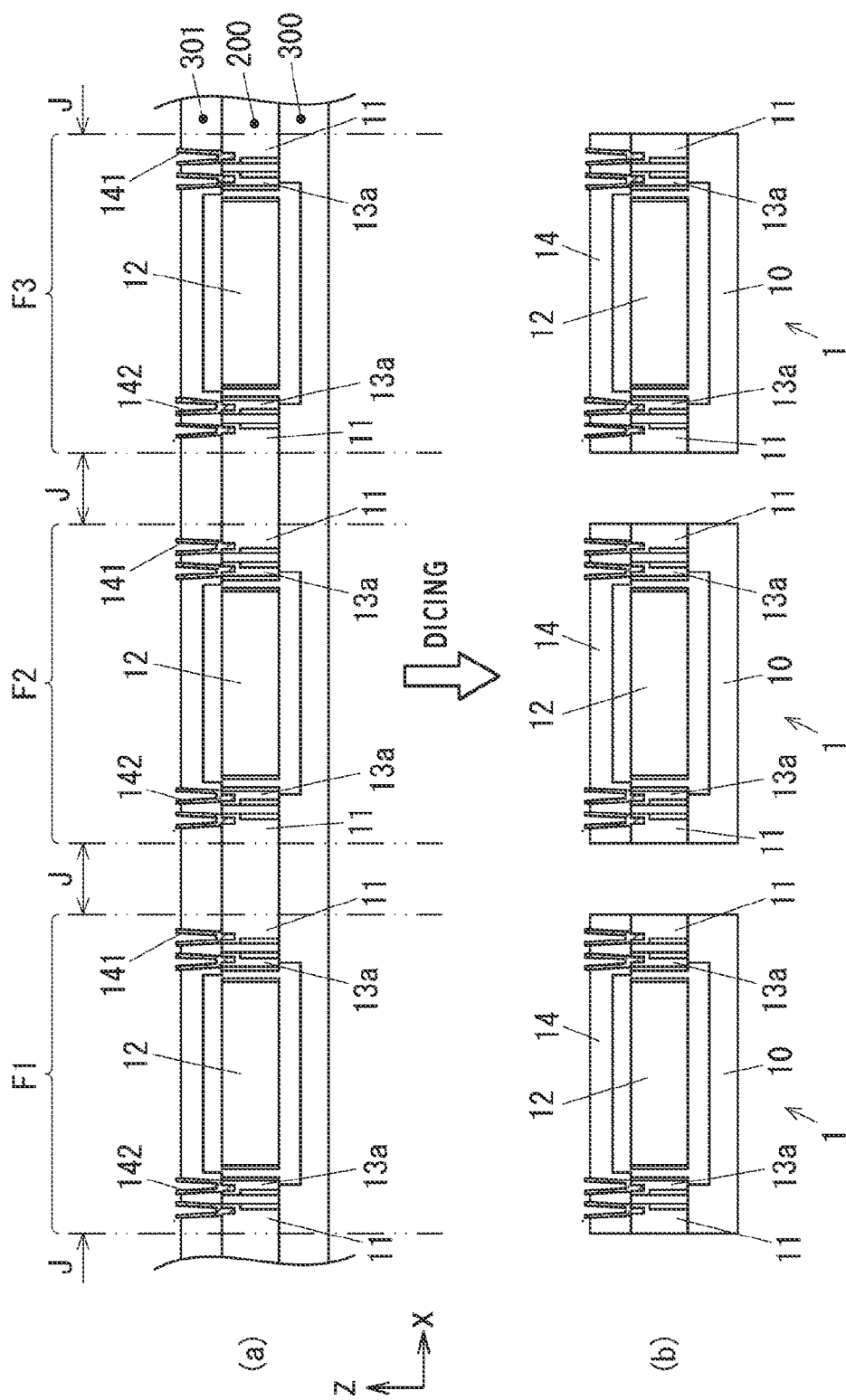
FIG. 23 is a view explaining a separation step by dicing in the case where multiple vibration-driven energy harvesting elements are collectively formed at a wafer level.

Although the production method is explained by using the drawings of one vibration-driven energy harvesting element 1 in the aforementioned explanation, in actual, multiple vibration-driven energy harvesting elements 1 are collectively formed at a wafer level and divided into individual vibration-driven energy harvesting elements 1 by dicing as illustrated in FIGS. 21 to 23.

The Si substrate 200 illustrated in FIG. 21 corresponds to FIG. 10(*b*) of the sixth step described above and the glass substrate 300 corresponds to FIG. 12(*b*) of the eighth step. The fixed portions 11, the moveable portion 12, and the elastically-supporting portions 13 are formed in each of element formation regions F1 to F3 of the Si substrate 200 and the recess portion 101 is formed in each of the regions F1 to F3 of the glass substrate 300. The element formation regions F1 to F3 are separated from one another by division regions J. The Si substrate 200 and the glass substrate 300 are anodically bonded to each other as in the ninth step illustrated in FIG. 13. After the anodical bonding, the same processing as that in the aforementioned tenth step is performed to achieve the state where the non-penetrating separation grooves g1 and g2 penetrate the Si substrate 200 from the front surface to the back surface thereof and to form the holes 111 and 131 in which the electrodes 141 and 142 are to be formed (see FIG. 22).

In the step illustrated in FIG. 22, the glass substrate 301 is anodically bonded to the Si substrate 200 side of the component obtained by anodically bonding the Si substrate 200 and the glass substrate 300 to each other. The fixed portions 11, the moveable portion 12, and the elastically-supporting portions 13 that are device components of the vibration-driven energy harvesting element are formed in each of the element formation regions F1 to F3 of the Si substrate 200. The recess portion 140 and the through holes 144*a* and 144*b* of the second glass package 14 are formed in each of the element formation regions F1 to F3 of the glass substrate 301. The Si substrate 200 and the glass substrate 301 are anodically bonded to each other as in the fifteenth step illustrated in FIG. 19. Moreover, the comb electrodes 110 and 120 (not shown) are formed into electrets simultaneously with this anodical bonding.

In the step illustrated in FIG. 23(*a*), the metal layer 102*a* formed on the glass substrate 300 of FIG. 22 and the metal layer 102*b* formed on the glass substrate 301 are removed by wet etching. Then, the electrodes 141 are formed in the regions of the holes 111 and the through holes 144*a* and the electrodes 142 are formed in the regions of the holes 131 and the through holes 144*b*. In the step illustrated in FIG. 23(*b*), a substrate (that is, electrostatic device intermediate body) in which the Si substrate 200 and the glass substrates 300 and 301 are integrated is divided at the division regions J by dicing and is separated into individual vibration-driven energy harvesting elements 1. Collectively forming multiple vibration-driven energy harvesting elements 1 and then separating them by dicing as described above can improve throughput of production and achieve cost reduction.

Operations and effects of the aforementioned embodiment are summarized as follows.

(1) As illustrated in FIGS. 1 to 3, the vibration-driven energy harvesting element 1 that is an electrostatic device includes: the fixed portions 11, the moveable portion 12, and the elastically-supporting portions 13 that are formed in the same Si substrate 200, the elastically-supporting portions 13 elastically supporting the moveable portion 12; the first glass package 10 that is anodically bonded to one of the front and back surfaces of the Si substrate 200 with the fixed portions 11 and the elastically-supporting portions 13 separated from one another; and the second glass package 14 that is anodically bonded to the other one of the front and back surfaces with the fixed portions 11 and the elastically-supporting portions 13 separated from one another and that forms the sealed space S in which the moveable portion 12 is arranged between the second glass package 14 and the first glass package 10. The electrets are formed at least partially in the fixed portions 11 and the moveable portion 12, and the electrodes 141 connected to the fixed portions 11 and exposed on the outer surface of the second glass package 14 and the electrodes 142 connected to the elastically-supporting portions 13 and exposed on the outer surface of the second glass package 14 are formed in the second glass package 14.

Anodically bonding the first glass package 10 to one surfaces of the fixed portions 11, the moveable portion 12, and the fixed areas 13a of the elastically-supporting portions 13 that are formed from the same Si substrate 200 and anodically bonding the second glass package 14 to the other surfaces allows the first glass package 10 and the second glass package 14 to function as a support stage that supports the fixed portions 11 and the elastically-supporting portions 13 in an separated state and to function also as a package having the sealed space S in which the moveable portion 12 is arranged. In this configuration, the anodical bonding of the second glass package 14 and the electret formation as described in FIG. 19 can be performed simultaneously. Moreover, the first glass package 10 is used as both of the support stage and the package. Thus, high throughput and low cost can be achieved.

Furthermore, since the structure is such that the sealed space S is sealed by anodically bonding edge regions of the first glass package 10 and the second glass package 14 to the fixed portions 11 and the fixed areas 13a, the sizes (that is, area) of the glass packages 10 and 14 in the plan view of FIG. 1 can be made the same as the area occupied by the functional elements (fixed portions 11, moveable portion 12, and elastically-supporting portions 13) of the vibration-driven energy harvesting element 1 by forming the electrodes 141 and 142 in the second glass package 14.

Note that the aforementioned vibration-driven energy harvesting element 1 has the configuration in which the fixed portions 11, the moveable portion 12, and the elastically-supporting portions 13 are made from the Si substrate 200 and the fixed portions 11 and the elastically-supporting portions 13 are packaged in the glass packages 10 and 14 made of glass substrates. Accordingly, it is possible to reduce cost from that of an electrostatic device formed by using expensive SOI substrates. Although the substrate 200 is a silicon substrate in the above description, the substrate 200 is not limited to a silicon substrate and glass substrates other than those described above, glass substrates on which silicon thin films are formed, and the like may be used as long as the coefficient of linear expansion sufficiently matches that of the glass substrates.

(2) The aforementioned electrostatic device is the vibration-driven energy harvesting element 1, the comb electrodes 110 are formed in the fixed portions 11 as fixed electrodes, the comb electrodes 120 facing the comb electrodes 110 are formed in the moveable portion 12 as movable electrodes, the electrets are formed in at least one of the set of comb electrodes 110 and the set of comb electrodes 120, the sealed space S formed between the glass packages 10 and 14 is set to the vacuum state, and displacement of the moveable portion 12 relative to the fixed portions 11 causes the electrostatic capacitance between the comb electrodes 110 and the comb electrodes 120 to change and the electrostatic device generates power.

Employing the glass packages 10 and 14 as described above can achieve size reduction of the vibration-driven energy harvesting element 1. Moreover, since the comb electrodes 110 and the comb electrodes 120 are arranged in the sealed space S in the vacuum state, deterioration of the electrets can be prevented. Furthermore, since the moveable portion 12 vibrates in the sealed space S in the vacuum state, attenuation of the vibration due to viscous resistance can be suppressed from that in the case where the moveable portion 12 vibrates in gas such as air.

(3) In the electrostatic device production method of producing the aforementioned electrostatic device, the fixed portions 11, the moveable portion 12, and the elastically-supporting portions 13 are formed in the Si substrate 200 in an integral state, the Si substrate 200 is stacked on the first glass package 10, the anodical bonding voltage (voltage V1 in FIG. 13) is applied between the first glass package 10 and the Si substrate 200 to anodically bond the fixed portions 11 and the elastically-supporting portions 13 to the first glass package 10, the Si substrate 200 is etched to separate the fixed portions 11 and the elastically-supporting portions 13 from one another, the second glass package 14 is stacked on the Si substrate 200 to which the first glass package 10 is anodically bonded, the anodical bonding voltage (voltage V2 in FIG. 19) is applied between the elastically-supporting portions 13 and the second glass package 14 while the electret formation voltage (voltage=V3−V2 in FIG. 19) is applied between the elastically-supporting portions 13 and the fixed portions 11 to anodically bond the fixed portions 11 and the elastically-supporting portions 13 to the second glass package 14 and to form the electrets, and the electrodes 141 connected to the fixed portions 11 and exposed on the outer surface of the second glass package 14 and the electrodes 142 connected to the moveable portion 12 and exposed on the outer surface of the second glass package 14 are formed.

Since the anodical bonding of the second glass package 14 and the electret formation can be simultaneously performed, it is possible to achieve high throughput and cost reduction.

(4) Moreover, anodically bonding the fixed portions 11 and the elastically-supporting portions 13 to the second glass package 14 in the vacuum state causes the sealed space S in which the comb electrodes 110 and 120 are arranged to be in the vacuum state and deterioration of the electrets can be prevented.

Furthermore, as illustrated in FIGS. 21 to 23, the multiple first glass packages 10 are formed in the glass substrate 300 in the non-separated state with the division regions J arranged between the adjacent first glass packages 10, the multiple second glass packages 14 are formed in the glass substrate 301 in the non-separated state with the division regions J arranged between the adjacent second glass packages 14, the multiple functional elements each including the fixed portions 11, the moveable portion 12, and the elastically-supporting portions 13 are formed in the same Si substrate 200 in the non-separated state with the division regions J arranged between the adjacent functional elements, and the Si substrate 200 to which the first and second glass packages 10 and 14 are anodically bonded is divided at the division regions J. Collectively forming multiple vibration-driven energy harvesting elements 1 and then separating them by dicing can improve the throughput of production and achieve cost reduction.

The present invention is not limited to the contents of the aforementioned embodiment and other embodiments conceivable within the scope of the technical spirit of the present invention are also included in the scope of the present invention. For example, although the vibration-driven energy harvesting element 1 that is the electrostatic device is used as an example in the description of the aforementioned embodiment, the present invention can be applied not only to the vibration-driven energy harvesting element 1 but also to sensors, actuators, and the like as described in PTL1.

The disclosed contents of the following basic application claiming the priority thereof are incorporated herein by reference.

Japanese Patent Application No. 2019-106231 (filed Jun. 6, 2019).

REFERENCE SIGNS LIST

1 . . . vibration-driven energy harvesting element, 10 . . . first glass package, 11 . . . fixed portion, 12 . . . moveable portion, 13 . . . elastically-supporting portion, 13*a* . . . fixed area, 13*b* . . . elastic portion, 14 . . . second glass package, 40 . . . heater, 110, 120 . . . comb electrodes, 141, 142 . . . electrode, 200 . . . Si substrate, 300, 301 . . . glass substrate, F1 to F3 . . . element formation region, J . . . division region, S . . . sealed space

The invention claimed is:

1. An electrostatic device comprising:
a fixed portion, a moveable portion, and an elastically-supporting portion that are formed in a substrate, the elastically-supporting portion elastically supporting the moveable portion;
a first glass package having a first peripheral portion that is anodically bonded to a peripheral portion of a first surface of the substrate that includes the fixed portion; and
a second glass package having a second peripheral portion that is anodically bonded to a second surface of the peripheral portion of the substrate that includes the fixed portion, wherein the first and second surfaces are opposite sides of the substrate, wherein the first glass package and the second glass package form a sealed space and the moveable portion is arranged in the sealed space between the first and second glass packages, wherein
the elastically-supporting portion comprises a fixed area that is included in the peripheral portion of the substrate that is bonded to the first glass package and to the second glass package,
the fixed portion and the fixed area are separated by a groove formed in the peripheral portion of the substrate,
at least a part of one of the fixed portion and the moveable portion includes an electret, and
a first electrode connected to the fixed portion and exposed on an outer surface of the second glass package and a second electrode connected to the elastically-supporting portion and exposed on the outer surface of the second glass package are formed in the second glass package.

2. The electrostatic device according to claim 1, wherein
a fixed electrode is formed in the fixed portion,
a movable electrode facing the fixed electrode is formed in the moveable portion,
the sealed space in which the fixed electrode and the movable electrode are arranged is set to a vacuum state, and
displacement of the moveable portion relative to the fixed portion causes an electrostatic capacitance between the fixed electrode and the movable electrode to change and the electrostatic device generates power.

3. A production method of producing the electrostatic device according to claim 1, comprising:
forming the fixed portion, the moveable portion, and the elastically-supporting portion in the substrate in an integral state;
stacking the substrate on the first glass package;
applying anodical bonding voltage between the first glass package and the substrate to anodically bond the fixed portion and the elastically-supporting portion to the first glass package;
etching the substrate to separate the fixed portion and the elastically-supporting portion from each other;
stacking the second glass package on the substrate to which the first glass package is anodically bonded;
applying anodical bonding voltage between the elastically-supporting portion and the second glass package while applying electret formation voltage between the elastically-supporting portion and the fixed portion to anodically bond the fixed portion and the elastically-supporting portion to the second glass package and to form the electret; and
forming the first electrode connected to the fixed portion and exposed on the outer surface of the second glass package and the second electrode connected to the moveable portion and exposed on the outer surface of the second glass package.

4. The production method according to claim 3, wherein the anodical bonding of the fixed portion and the elastically-supporting portion to the second glass package is performed in a vacuum state.

5. The production method according to claim 3, wherein
a plurality of the first glass packages are formed in a first glass substrate in a non-separated state with a division region arranged between the first glass packages,
a plurality of the second glass packages are formed in a second glass substrate in a non-separated state with a division region arranged between the second glass packages,
a plurality of functional elements each including the fixed portion, the moveable portion, and the elastically-supporting portion are formed in a same substrate in a non-separated state with a division region arranged between the functional elements, and
the substrate to which the first and second glass packages are anodically bonded is divided at the division regions.

6. An electrostatic device intermediate body comprising:
a substrate in which a plurality of device components each including the fixed portion, the moveable portion, and the elastically-supporting portion of the electrostatic device according to claim 1 are integrally formed; and
first and second glass packages that vacuum-package the substrate.

7. A production method comprising performing singulation on the electrostatic device intermediate body according to claim 6 to produce the electrostatic device.

* * * * *